(12) United States Patent
Dykaar

(10) Patent No.: US 10,319,754 B2
(45) Date of Patent: Jun. 11, 2019

(54) METHOD OF FABRICATING CRYSTALLINE ISLAND ON SUBSTRATE

(71) Applicant: DIFTEK LASERS, INC., Waterloo (CA)

(72) Inventor: Douglas R. Dykaar, Waterloo (CA)

(73) Assignee: DIFTEK LASERS, INC., Waterloo, Ontario (CA)

( * ) Notice: Subject to any disclaimer, the term of this patent is extended or adjusted under 35 U.S.C. 154(b) by 0 days.

(21) Appl. No.: 15/429,367

(22) Filed: Feb. 10, 2017

(65) Prior Publication Data

US 2017/0154903 A1    Jun. 1, 2017

Related U.S. Application Data

(63) Continuation-in-part of application No. 15/184,429, filed on Jun. 16, 2016, now Pat. No. 9,601,329, which
(Continued)

(51) Int. Cl.
*H01L 27/12* (2006.01)
*H01L 21/762* (2006.01)
(Continued)

(52) U.S. Cl.
CPC ........ *H01L 27/1281* (2013.01); *C30B 11/002* (2013.01); *C30B 11/003* (2013.01);
(Continued)

(58) Field of Classification Search
CPC ............... H01L 27/1274; H01L 27/32; H01L 21/76232; H01L 21/0243
See application file for complete search history.

(56) References Cited

U.S. PATENT DOCUMENTS

2015/0357192 A1 * 12/2015 Dykaar ................. C30B 29/06
438/479

FOREIGN PATENT DOCUMENTS

CN    102695914 A    9/2012
EP    2953158 A2    12/2015
(Continued)

OTHER PUBLICATIONS

Communication pursuant to Article 94(3) EPC dated Jan. 3, 2017 for European Patent Application No. 15153173.8.
(Continued)

*Primary Examiner* — Yu-Hsi D Sun
(74) *Attorney, Agent, or Firm* — Perry + Currier, Inc.

(57) ABSTRACT

Certain electronic applications, such as OLED display back panels, require small islands of high-quality semiconductor material distributed over a large area. This area can exceed the areas of crystalline semiconductor wafers that can be fabricated using the traditional boule-based techniques. This specification provides a method of fabricating a crystalline island of an island material, the method comprising depositing particles of the island material abutting a substrate, heating the substrate and the particles of the island material to melt and fuse the particles to form a molten globule, and cooling the substrate and the molten globule to crystallize the molten globule, thereby securing the crystalline island of the island material to the substrate. The method can also be used to fabricate arrays of crystalline islands, distributed over a large area, potentially exceeding the areas of crystalline semiconductor wafers that can be fabricated using boule-based techniques.

22 Claims, 22 Drawing Sheets

Related U.S. Application Data is a continuation-in-part of application No. 14/610,567, filed on Jan. 30, 2015, now Pat. No. 9,396,932.

(60) Provisional application No. 62/007,624, filed on Jun. 4, 2014.

(51) Int. Cl.
  *C30B 11/00* (2006.01)
  *C30B 29/06* (2006.01)
  *H01L 21/02* (2006.01)

(52) U.S. Cl.
  CPC .......... *C30B 29/06* (2013.01); *H01L 21/0243* (2013.01); *H01L 21/02236* (2013.01); *H01L 21/02532* (2013.01); *H01L 21/02587* (2013.01); *H01L 21/02667* (2013.01); *H01L 21/76262* (2013.01); *H01L 27/1218* (2013.01); *H01L 27/1262* (2013.01)

(56) References Cited

FOREIGN PATENT DOCUMENTS

| | | |
|---|---|---|
| JP | H0480922 A | 3/1992 |
| JP | 2005089239 A | 4/2005 |
| JP | 2008119929 A | 5/2008 |
| WO | WO-2011034908 A1 | 3/2011 |

OTHER PUBLICATIONS

First Office Action (with English Translation appended) dated Aug. 1, 2017, by SIPO, re Chinese Patent Application No. 201510295774. 17 pages.

Dykaar, Douglas R., "Method of Fabricating Crystalline Island on Substrate", U.S. Appl. No. 14/610,567, filed Jan. 30, 2015, now U.S. Pat. No. 9,396,932, Issued No. Jul. 19, 2016.

Dykaar, Douglas R., "Method of Fabricating Crystalline Island on Substrate", U.S. Appl. No. 15/184,429, filed Jun. 16, 2016.

Drevet, B., & Eustathopoulos, N. (2012). Wetting of ceramics by molten silicon and silicon alloys: a review. Journal of Materials Science, 47(24), 8247-8260.

Extended European Search Report (EESR) dated Sep. 25, 2017, by EPO, re European Patent Application No. 17162353.1.

Drevet, B., Pajani, O., & Eustathopoulos, N. (2010). Wetting, infiltration and sticking phenomena in Si 3 N 4 releasing coatings in the growth of photovoltaic silicon. Solar Energy Materials and Solar Cells, 94(3), 425-431.

Decision of Rejection (with English translation) dated Aug. 29, 2017, by JPO, re Japanese Patent Application No. 2015-107915.

JPO, Notification of Reasons for Refusal (w/ English translation), dated Mar. 26, 2019, re Japanese Patent Application No. 2017-253337.

\* cited by examiner

METHOD OF FABRICATING CRYSTALLINE ISLAND ON SUBSTRATE

CROSS-REFERENCE TO RELATED APPLICATION

This application is a continuation-in-part of U.S. patent application Ser. No. 15/184,429, filed on Jun. 16, 2016 and published as US 2016/0300716, which is incorporated herein by reference in its entirety. U.S. patent application Ser. No. 15/184,429, in turn, is a continuation-in-part of U.S. patent application Ser. No. 14/610,567, filed on Jan. 30, 2015 and published as US 2015/0357192, which is also incorporated herein by reference in its entirety. U.S. Ser. No. 14/610,567, in turn, claims priority from U.S. Provisional Patent Application No. 62/007,624, filed on Jun. 4, 2014, which is also incorporated herein by reference it its entirety.

FIELD

The present specification relates to a method of fabricating one or more crystalline islands of an island material abutting a substrate.

BACKGROUND

Certain electronic applications, such as OLED display back panels, require small islands of high-quality semiconductor material distributed over a large area. This area can be 50 inches diagonally and larger, and exceeds the sizes of crystalline semiconductor wafers that can be fabricated using the traditional boule-based techniques.

WO 2013/053052 A1, incorporated herein by reference, discloses fabricating a large number of small, loose, crystalline semiconductor spheres. The spheres are then distributed on a patterned substrate and affixed to the substrate at predetermined locations to form an array of spheres on the substrate. Planarizing the spheres exposes a cross-section of each sphere, thereby providing an array of high-quality, crystalline semiconductor islands for device fabrication on a globally planarized surface.

U.S. Pat. No. 4,637,855, incorporated herein by reference, discloses fabricating spheres of silicon on a substrate by applying a slurry of metallurgical grade silicon to the substrate and then patterning the slurry layer to provide regions of metallurgical silicon of uniform size. The substrate is then heated to melt the silicon, which then beads to the surface to form molten spheres of silicon, which are then cooled to crystallize them. The spheres have very weak adhesion to the substrate and are easily detached from the substrate by simply knocking them loose. The loose spheres are collected and undergo further processing.

US 2012/0067273 A1, incorporated herein by reference, discloses fabricating silicon wafers by bringing a substrate into contact with a reservoir of molten silicon, forming a layer of solid silicon on the substrate, and subsequently detaching the solid layer from the substrate. The disclosed method can potentially be used to fabricate silicon wafers with large areas.

SUMMARY

Provided herein is a method of fabricating one or more crystalline islands of an island material abutting a substrate. For each crystalline island, particles of the island material are deposited abutting the substrate, and the substrate and the particles are then heated to melt and fuse the particles to form a respective molten globule. The substrate and the respective molten globules are then cooled to crystallize the molten globules, thereby securing the crystalline islands to the substrate.

This method can allow for fabricating crystalline islands using particulate starting materials. In addition, in some implementations the crystalline islands being secured to the substrate can allow for further processing of the islands; for example, planarizing at least a portion of each crystalline island to expose a cross-section of each island. If the crystalline islands are sufficiently high-quality crystalline semiconductors, these cross-sections can then be used to fabricate electronic devices. This method can also allow for fabricating arrays of crystalline islands, distributed over an area potentially exceeding the areas of crystalline semiconductor wafers that can be fabricated using traditional boule-based techniques.

According to an aspect of the present specification, there is provided a method of fabricating a crystalline island of an island material, the method comprising depositing particles of the island material abutting a substrate, heating the substrate and the particles of the island material to melt and fuse the particles to form a molten globule, and cooling the substrate and the molten globule to crystallize the molten globule, thereby securing the crystalline island of the island material to the substrate.

The crystalline island can comprise a single crystal of the island material or a polycrystalline form of the island material.

The method can further comprise planarizing at least a portion of the crystalline island to expose a cross-section of the crystalline island.

The securing can comprise the molten globule wetting the substrate at a wetting angle smaller than about 90 degrees and the crystalline island adhering to the substrate.

The depositing can comprise defining a depression in the substrate, and transferring the particles of the island material into the depression.

When the depositing comprises defining a depression and transferring the particles of the island material into the depression, the securing can comprise a portion of a surface of the depression enveloping a portion of a surface of the crystalline island.

When the depositing comprises defining a depression and transferring the particles of the island material into the depression, the depression can be shaped to have at least one vertex.

When the depositing comprises defining a depression and transferring the particles of the island material into the depression, the depression can comprise a first depression, and a second depression within the first depression, the second depression smaller and deeper than the first depression.

When the depositing comprises defining a depression and transferring the particles of the island material into the depression, the transferring can comprise one or more of doctor-blading the particles of the island material into the depression, and electrostatic deposition of the particles of the island material into the depression using a charged pin.

When the depositing comprises defining a depression and transferring the particles of the island material into the depression, the transferring can comprise flowing a suspension onto the substrate and into the depression, the suspension comprising a dispersion of the particles of the island material in a carrier medium, and squeegeeing the suspension located on the substrate outside the depression; and the heating can further comprise eliminating the carrier medium prior to the melting and fusing the particles of the island material.

The cooling can comprise one or more of oxidizing an outer surface of the molten globule, super-cooling the molten globule, and applying a physical impact to the substrate.

The depositing can comprise transferring particles of the island material into a through hole in the substrate.

When the depositing comprises transferring particles of the island material into a through hole in the substrate, pressure can be applied at a second end of the through hole to push the molten globule partially out of a first end of the through hole to form a convex meniscus.

When the depositing comprises transferring particles of the island material into a through hole in the substrate, the securing can comprise a portion of a surface of the through hole enveloping a portion of a surface of the crystalline island.

When the depositing comprises transferring particles of the island material into a through hole in the substrate, the method can further comprise after the cooling to crystallize the molten globule, planarizing a portion of the meniscus to expose a cross-section of the crystalline island.

When the depositing comprises transferring particles of the island material into a through hole in the substrate, a portion of a surface of the substrate outside the through hole and adjacent a first end of the through hole can have a wetting angle with the molten globule of less than about 90 degrees.

The depositing can comprise dispersing the particles of the island material in a carrier medium to create a suspension and transferring the suspension onto the substrate, and the heating can further comprise eliminating the carrier medium prior to the melting and fusing the particles of the island material.

When the depositing can comprise dispersing the particles of the island material in a carrier medium to create a suspension and transferring the suspension onto the substrate, and the heating can further comprise eliminating the carrier medium prior to the melting and fusing the particles of the island material, the transferring can comprise one or more of stamping the suspension onto the substrate, screen printing the suspension onto the substrate, inkjet printing the suspension onto the substrate, and spin-coating the suspension onto the substrate, and lithographically patterning the spin-coated suspension.

The depositing can comprise dispersing the particles of the island material in a carrier medium to create a suspension, forming the suspension into a sheet, causing the sheet to solidify to form a solid sheet, patterning the solid sheet by removing one or more portions of the sheet to form a patterned sheet, and overlaying the patterned sheet on the substrate; and the heating can further comprise eliminating the carrier medium prior to the melting and fusing the particles of the island material.

The molten globule can have a first wetting angle with a first portion of a surface of the substrate in contact with the molten globule, and a second wetting angle with a second portion of the surface of the substrate, the second portion abutting the first portion, and the second wetting angle being greater than the first wetting angle.

An area of the substrate in contact with the molten globule can comprise one or more of one or more guiding protrusions, one or more guiding depressions, and a metallic grid for controlling initiation of crystallization as the molten globule is cooled.

The coefficient of thermal expansion (CTE) of the substrate at a temperature within about 20° C. of the melting point of the island material can match the CTE of the island material at the melting point of the island material.

The island material can comprise silicon.

The substrate can comprise alumina.

The securing can comprise over-coating the crystalline island and the substrate with an over-coating layer to form a stack whereby the crystalline island is sandwiched between the substrate and the over-coating layer.

When the securing comprises over-coating the crystalline island and the substrate with an over-coating layer to form a stack whereby the crystalline island is sandwiched between the substrate and the over-coating layer, the method can further comprise planarizing the stack to expose a cross-section of the crystalline island.

According to a further aspect of the present specification, there is provided a method of fabricating a crystalline island of an island material, the method comprising depositing particles of the island material on a first substrate, sandwiching the particles of the island material between the first substrate and a second substrate by placing the second substrate adjacent the first substrate, heating the first substrate, the second substrate, and the particles of the island material to melt and fuse the particles to form a molten globule, cooling the first substrate, the second substrate, and the molten globule to crystallize the molten globule, thereby forming the crystalline island of the island material.

The cooling can further comprise one or more of applying a pressure pulse to the molten globule, adding a seed crystal to the molten globule, and super-cooling the molten globule.

The first substrate can have a first area being a portion of a surface of the first substrate that comes into contact with the molten globule, and the second substrate can have a second area being a portion of a surface of the second substrate that comes into contact with the molten globule, and one or more of the first area and the second area can comprise one or more of one or more protrusions, one or more depressions, a metallic grid, for controlling initiation of crystallization as the molten globule is cooled.

According to a further aspect of the present specification, there is provided a method of fabricating a crystalline island of an island material, the method comprising: depositing particles of the island material abutting a substrate; heating the substrate and the particles of the island material to melt and fuse the particles to form a molten disk; cooling the substrate and the molten disk to crystallize the molten disk, thereby securing the crystalline island of the island material to the substrate; and planarizing at least a portion of the crystalline island to expose a cross-section of the crystalline island.

According to a further aspect of the present specification, there is provided a method of fabricating a crystalline island of an island material, the method comprising: depositing the island material on a substrate; heating the substrate and the island material, the heating melting the island material to form a first molten disk, the heating also forming a second molten disk comprising oxygen and the island material, the second molten disk disposed between the first molten disk and the substrate; and cooling the substrate, the first molten disk, and the second molten disk to crystallize the first molten disk, thereby forming the crystalline island of the island material.

The method can further comprise planarizing at least a portion of the crystalline island to expose a cross-section of the crystalline island.

The method can further comprise, after the cooling: over-coating the crystalline island and the substrate with an over-coating layer to form a stack; and planarizing the stack to expose a cross-section of the crystalline island.

The method of claim can further comprise, before the depositing: forming an oxide layer on the substrate; and wherein: the depositing can comprise depositing the island material on the oxide layer; and the second molten disk can comprise the oxide layer in a molten state.

The forming the oxide layer can comprise depositing on the substrate the oxide layer comprising an oxide of the island material.

The depositing can comprise depositing the oxide layer according to a predetermined pattern.

The forming the oxide layer can comprise: depositing the island material on the substrate according to a predetermined pattern; and oxidizing the island material.

The depositing the island material can comprise one or more of: depositing particles of the island material; and depositing a layer of the island material.

The heating can comprise heating the substrate, the island material, and the oxide layer in a non-oxidizing atmosphere.

The method can further comprise one or more of, before the depositing: polishing the substrate according to a predetermined pattern; and roughening the substrate according to the predetermined pattern.

The depositing can comprise depositing the island material on the substrate in a shape of a plurality of interconnected nodes, each node connected to one or more other nodes.

The second molten disk can further comprise aluminum originating from the substrate.

The heating can comprises heating the substrate and the island material to at least about 1500° C.

The first molten disk can have a maximum thickness that is at least about ten times smaller than the smaller of its maximum length and maximum width.

According to a further aspect of the present specification, there is provided a semiconductor device comprising: a substrate; an intermediary disk disposed on the substrate, the intermediary disk comprising oxygen and an island material; and an island disk disposed on the intermediary disk, the island disk comprising the island material, the island disk being crystalline; wherein: the island material is deposited on the substrate; and the intermediary disk is formed by melting and then solidifying the island material on the substrate.

The substrate can comprise alumina and the island material comprises silicon.

The intermediary disk can further comprise aluminum originating from the substrate.

According to a further aspect of the present specification, there is provided a method of fabricating a crystalline island of an island material, the method comprising: depositing the island material on a substrate; heating the substrate and the island material, the heating melting the island material to form a molten corpus, the heating also forming a molten disk comprising oxygen and the island material, the molten disk disposed between the molten corpus and the substrate; and cooling the substrate, the molten corpus, and the molten disk to crystallize the molten corpus to form a crystallized corpus, at least a portion of the crystallized corpus forming the crystalline island of the island material.

The method can further comprise planarizing at least a portion of the crystalline island to expose a cross-section of the crystalline island.

The method can further comprise, after the cooling: over-coating the crystalline island and the substrate with an over-coating layer to form a stack; and planarizing the stack to expose a cross-section of the crystalline island.

The method can further comprise, before the depositing: forming an oxide layer on the substrate; and wherein: the depositing comprises depositing the island material on the oxide layer; and the molten disk comprises the oxide layer in a molten state.

The forming the oxide layer can comprise depositing on the substrate the oxide layer comprising an oxide of the island material.

The depositing can comprise depositing the oxide layer according to a predetermined pattern.

The forming the oxide layer can comprise: depositing the island material on the substrate according to a predetermined pattern; and oxidizing the island material.

The heating can comprise heating the substrate, the island material, and the oxide layer in a non-oxidizing atmosphere.

The method can further comprise one or more of, before the depositing: polishing the substrate according to a predetermined pattern; and roughening the substrate according to the predetermined pattern.

The substrate can comprise alumina.

The molten disk can further comprise aluminum originating from the substrate.

The island material can comprise silicon and the heating can comprise heating the substrate and the island material to at least about 1500° C.

Cooling the molten corpus can form a first solid portion distal from the substrate and a second solid portion proximal the substrate, the first solid portion separating spontaneously from the second solid portion during the cooling, the second solid portion forming the crystalline island.

The depositing can comprise: positioning a template on a surface of the substrate, the template comprising a channel having a first end abutting the surface and a second end opposite the first end, the surface capping the first end; and filling at least a portion of the channel with the island material.

The method can further comprise: after the cooling, removing the template from the substrate.

After the removing, a first portion of the crystallized corpus can remain on the substrate to form the crystalline island and a second portion of the crystallized corpus can remain in the channel.

The channel can comprise: a first region proximate the first end, in the first region the channel having a first cross-sectional area; and a second region distal from the first end, in the second region the channel having a second cross-sectional area, the first cross-sectional area different from the second cross-sectional area.

An inner surface of the channel can define a vertex separating the first region from the second region.

The template can further comprise one or more further channels, each further channel having a corresponding first end abutting the surface and a corresponding second end opposite the corresponding first end, the surface capping the corresponding first end; and the depositing can further comprise filling at least a portion of the one or more further channels with the island material.

The second end can be in communication with a reservoir configured to store the island material for at least partially filling the channel with the island material.

The reservoir can be integrally formed with the template.

The reservoir can comprise a crystallization initiator, the crystallization initiator comprising one or more of a depression into and an extension from a reservoir surface, the crystallization initiator configured to come into contact with the molten corpus and initiate crystallization during the cooling.

DESCRIPTION OF THE DRAWINGS

For a better understanding of the various implementations described herein and to show more clearly how they may be carried into effect, reference will now be made, by way of example only, to the accompanying drawings in which.

DETAILED DESCRIPTION

Figure 1:
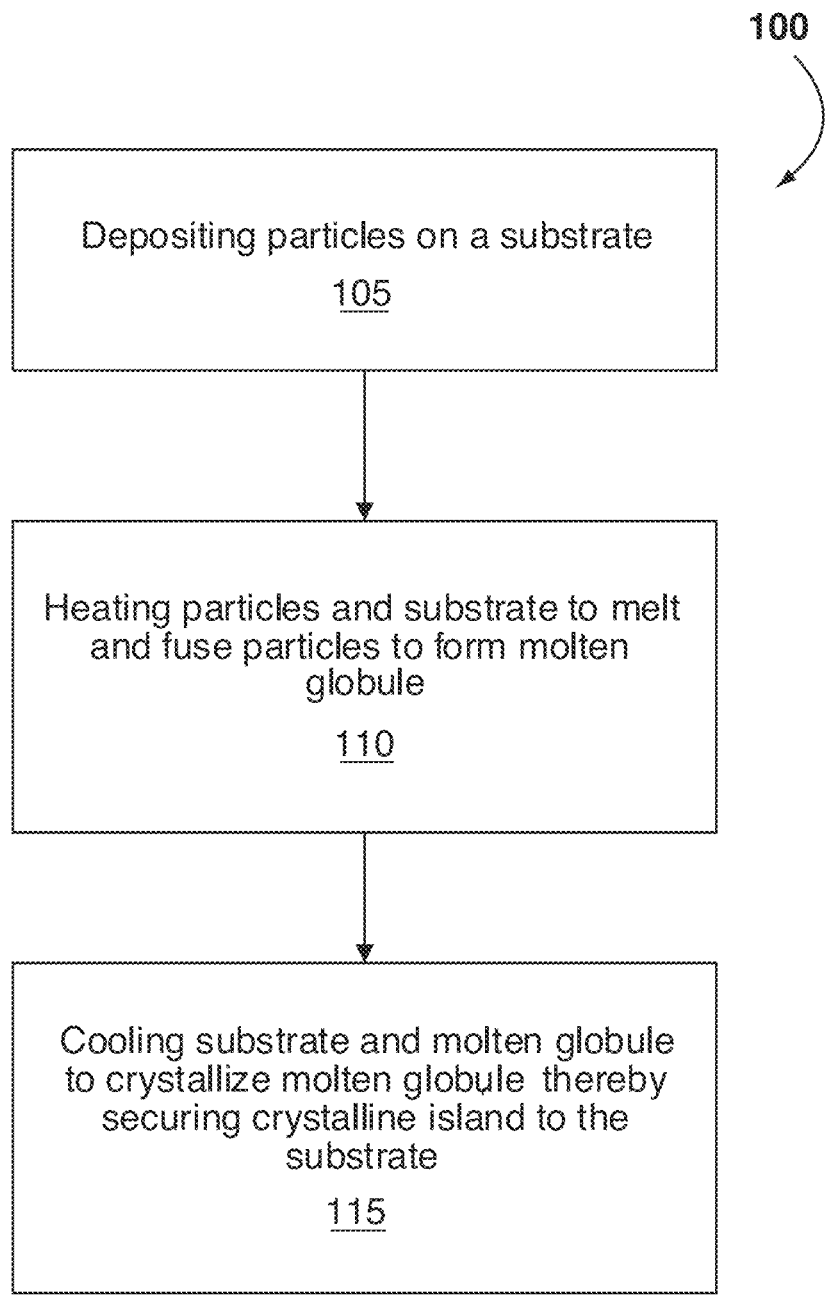
FIG. 1 depicts a method of fabricating a crystalline island abutting a substrate, according to non-limiting implementations.

An implementation of the present invention is reflected in method 100 shown in FIG. 1. Method 100 can be used to fabricate a crystalline island abutting a substrate, on top of or inside a substrate. First, as shown in box 105, island material can be deposited abutting the substrate, on or in the substrate. The island material can be in particulate form. Particles of the island material can be deposited at a predetermined location relative to the substrate, which can include, but is not limited to, deposition on all or a portion of the surface of the substrate. Particles of the island material can be deposited as a substantially pure powder, a powder with some additives or impurities, or as particles of the island material suspended in a carrier medium. Additives can be used to dope, alloy, or otherwise compound the island material.

Subsequently, as shown in box 110, the substrate and the particles of the island material can be heated. The heating can be by conduction, convection, and/or radiative heating, and can be performed in a furnace, kiln, or other suitable heating apparatus known to the skilled person. The heating melts and fuses the particles of the island material to form a molten globule of the island material. When a carrier medium is used to deposit the island material, the heating can evaporate, burn off, or otherwise eliminate the carrier medium before the melting and fusing of the island material particles. The island and substrate materials can be chosen so that the substrate does not melt at the temperature required to melt and fuse the particles of the island material.

Subsequently, as shown in box 115, the substrate and the molten globule are cooled to crystallize the molten globule, thereby securing the resulting crystalline island to the substrate. In some implementations, the islands are secured strongly enough to allow mechanical polishing, or other abrasive processing, of the island to expose a cross-section of the island, without dislodging the island from the substrate.

Figure 2:
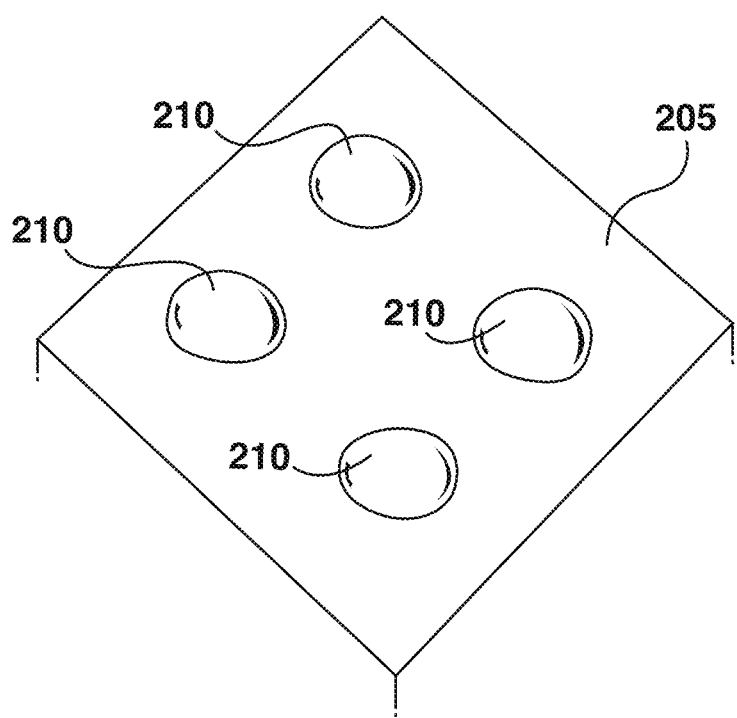
FIG. 2 depicts a top perspective view of crystalline islands on a substrate, according to non-limiting implementations.

FIG. 2 shows an array of crystalline islands 210 formed on substrate 205. Method 100 can be used to fabricate one or any number of crystalline islands. When a plurality of islands is formed, they can be arranged in an ordered array, or can be distributed on the substrate without perceptible periodic ordering. In some implementations, the position of each island 210 relative to substrate 205 is known to allow for subsequent processing of the islands.

Islands 210 can be single-crystalline or poly-crystalline. Nano-crystalline and amorphous islands can also be formed. In some implementations after islands 210 are formed, they are planarized, abraded, or otherwise operated upon so that some material is removed from the surfaces thereof to expose a cross-section of each island. This exposed cross-section can then be used to fabricate electronic devices, for example when the islands are formed from a semiconductor such as silicon.

When the starting particulate island material has impurities, the process of melting and crystallizing set out in method 100 can reduce the impurities inside the crystalline islands by pushing the impurities towards the surface of each molten globule as a crystalline lattice begins to form inside the molten globule, a process known as gettering. The lattice then tends to exclude any impurities that would interfere with its ordered arrangement of atoms, thereby excluding at least a portion of the impurities from the inside of the crystal. When the crystalline islands are poly-crystalline, the impurities are pushed to the grain boundaries between the crystals.

Figure 3:
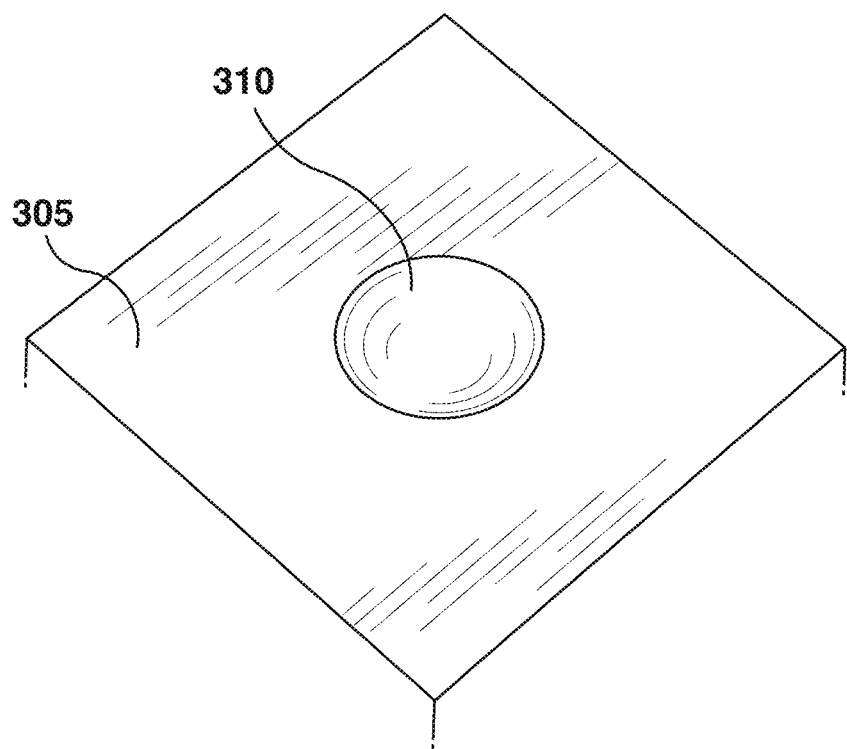
FIG. 3 depicts a top perspective view of a substrate having a depression, according to non-limiting implementations.

In some implementations, particles of the island material are deposited onto the substrate by transferring the island material into one or more depressions defined in the substrate surface. FIG. 3 shows depression 310 in substrate 305. In some implementations a plurality of depressions can be defined, and they can be arranged into an ordered array. The depressions can be defined lithographically, or using other means known to the skilled person, including but not limited to laser ablation or localized etching using a photolithographically defined mask.

Figure 4:
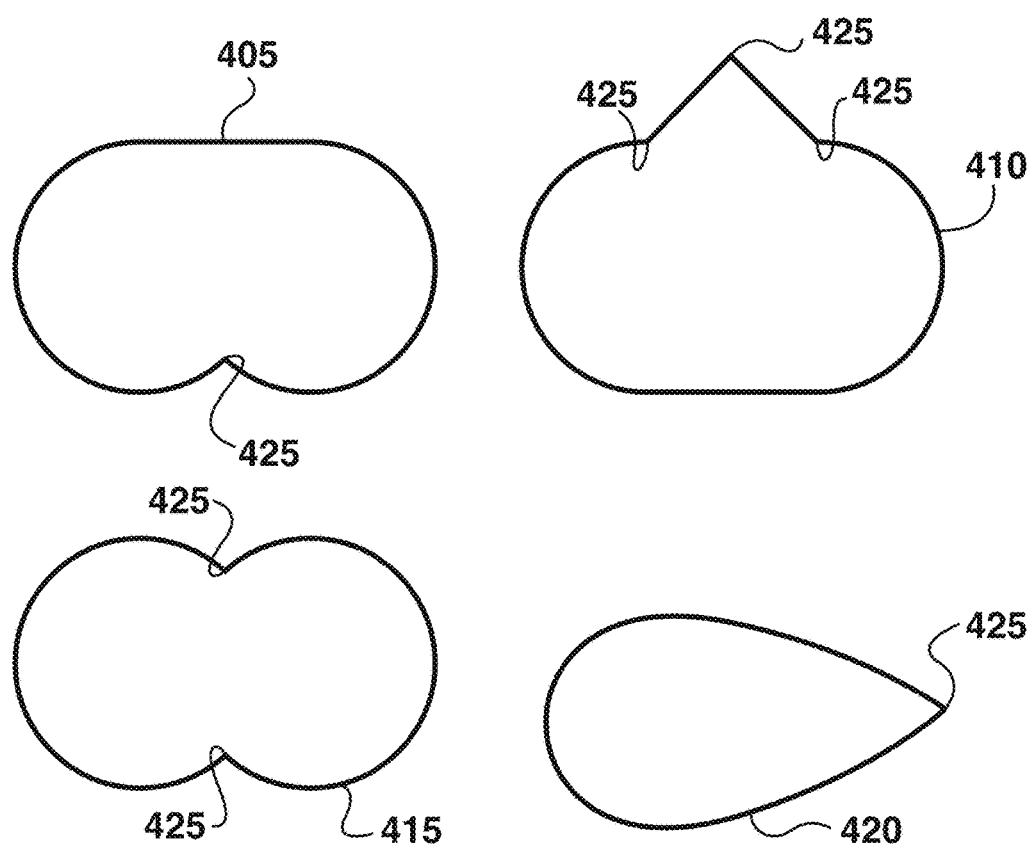
FIG. 4 depicts a collection of possible shapes for a depression, according to non-limiting implementations.

The depression 310 contains the molten globule, and can serve to more precisely locate the molten globule, and the resulting crystalline island, relative to the substrate 305. In addition, the shape of the depression can guide the crystallization process by providing nucleation sites for initiating crystallization. In some implementations, the depression can have one or more vertexes 425 as shown in FIG. 4 in relation to depressions 405, 410, 415, and 420. The vertex 425 can be at the end of a taper such as in the case of depression 420, or part of a reverse taper, as shown in depressions 405 and 415. A depression can have multiple vertexes as shown in depressions 410 and 415. Having multiple nucleation sites in the form of vertexes 425 increases the likelihood for the island being poly-crystalline and decreases the likelihood of formation of a single-crystalline island. Nucleation sites can also be three-dimensional smaller depressions into or protrusions from the surface of depression 310. Such smaller depressions can have one or more vertexes (not shown). These vertexes can in turn serve as a nucleation site for crystallization of the molten globule.

Figure 5:
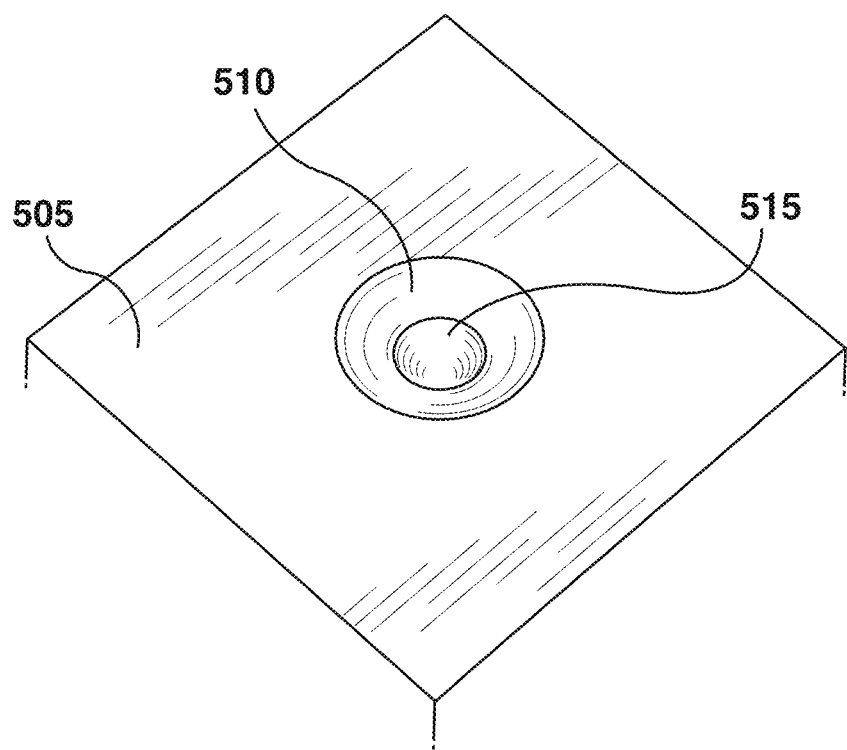
FIG. 5 depicts a top perspective view of a substrate having a depression within a depression, according to non-limiting implementations.

As shown in FIG. 5, in some implementations, substrate 505 can have a larger and shallower depression 510, within which there can be a smaller and deeper depression 515.

Figure 6A:
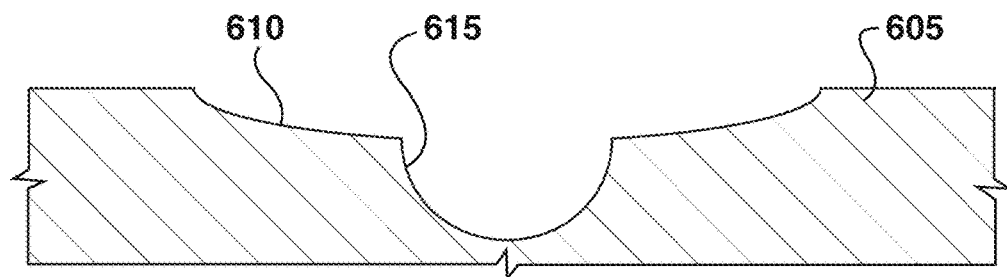
FIGS. 6a-d depict a cross-section of a substrate having a depression within a depression at different stages of forming a crystalline island in the depressions, according to non-limiting implementations.
Figure 6B:
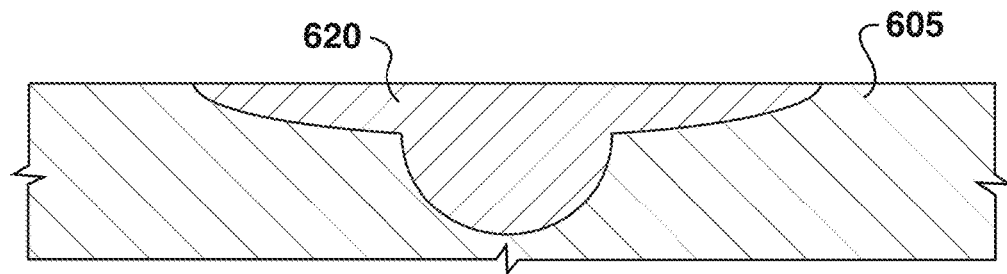
Figure 6C:
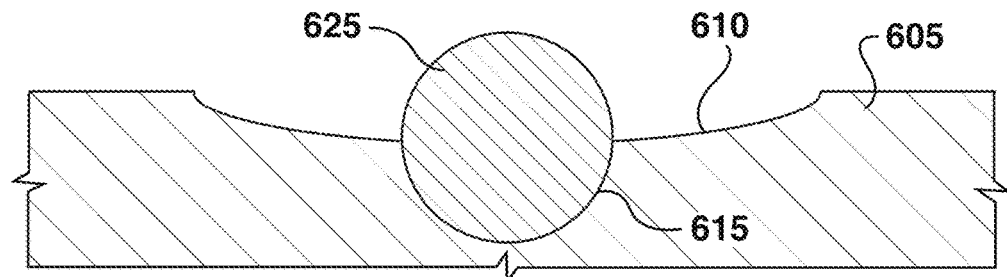
Figure 6D:
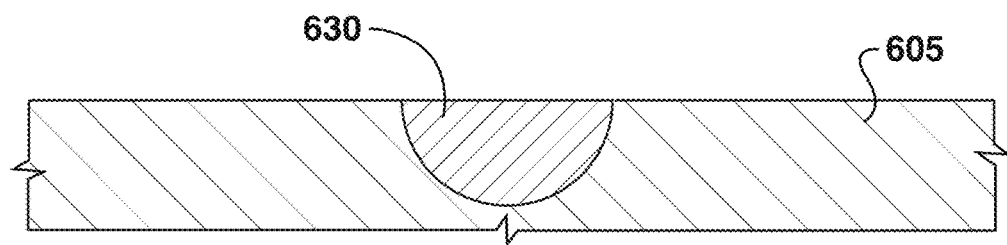

FIGS. 6a-d show a cross-section of a substrate 605, with a larger depression 610 and a smaller and deeper depression 615 within depression 610. As shown in FIG. 6b, particles of the island material 620 can be deposited to fill both the larger and the smaller depressions 610 and 615. As shown in FIG. 6c, when the particles are melted, they fuse to form molten globule 625. The surface tension of the molten globule can pull it into an approximately spherical shape, which is then cooled and crystallizes to form a crystalline island. As shown in FIG. 6d, the crystalline island and/or the substrate 605 can be planarized to yield a crystalline island 630 in substrate 605. Depression 610 serves as a reservoir for particles of the island material which eventually form the molten globule 625. Depression 615, in turn, serves to locate the molten globule 625 and initiate its crystallization using vertexes discussed above in relation to FIG. 5.

The relative volume of depressions 610 and 615 can determine the size of the molten globule. This, combined with the depth of depressions 610 and 615 can determine the size of cross-section of crystalline island 630 available at different depths of substrate 605. When particles of island material 620 fuse to form molten globule 625 leaving at least a portion of the volume of depression 610 empty, this empty space can be back-filled after molten globule 625 crystallizes. This back-filling can help to create a planar surface.

Figure 7:
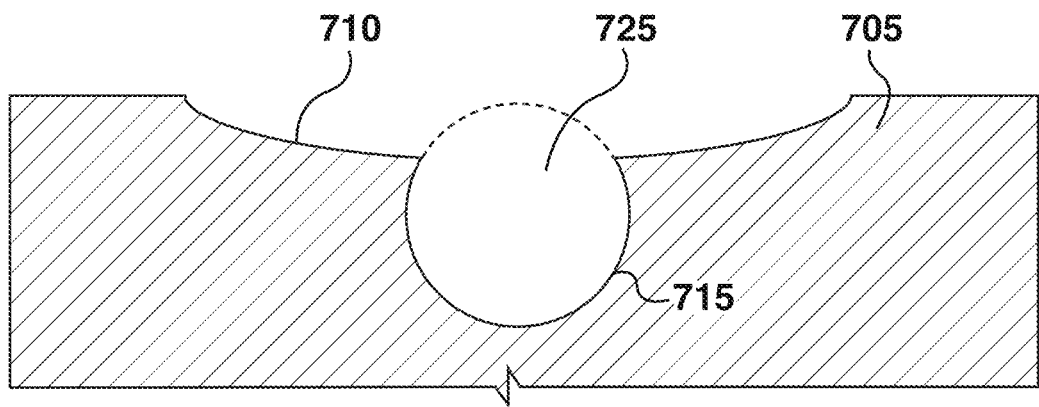
FIG. 7 depicts a cross-section of a substrate having a depression within a depression, according to non-limiting implementations.

FIG. 7 shows a side elevation cross-section of a substrate 705 having large depression 710, and small depression 715 within large depression 710. As shown in the cross-section, the surface of small depression 715 envelops more than half of molten globule 725 (shown in dotted line) thereby physically securing the crystallized molten globule 725 to the substrate. Even in implementations where the surface of small depression 715 envelops less than half of the molten globule 725, the enveloping can still contribute to physically securing the crystalline island to the substrate. The shape of depression 715 is not limited to a portion of a sphere. Any suitable shape can be used. When it is desirable to physically secure the crystalline island to the substrate, the shape of depression 715 can be used whereby the molten globule can flow into the shape, but the solid crystalline island cannot be physically removed from depression 715. An example of such shapes for depression 715 can be any shape where the opening of depression 715 is smaller than the largest dimension of the crystalline island that must pass through the opening in order for the crystalline island to be removed from depression 715.

Figure 8:
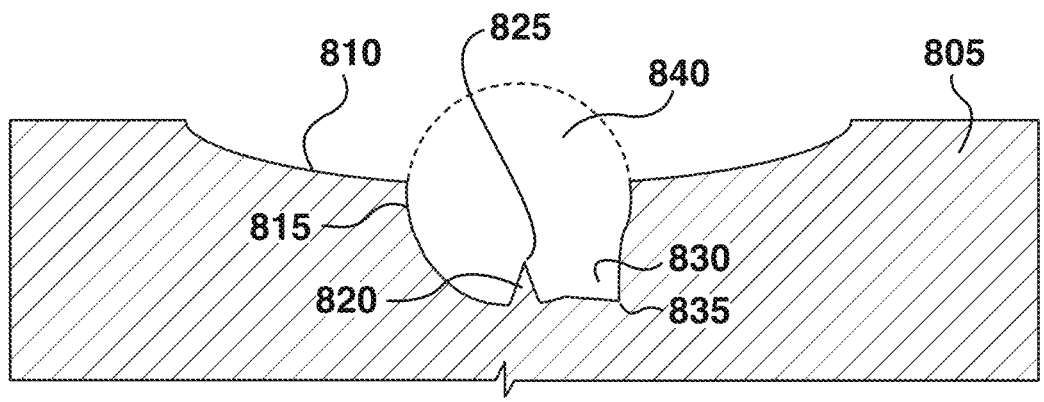
FIG. 8 depicts a cross-section of a substrate having a depression within a depression, according to non-limiting implementations.

FIG. 8 shows a side elevation cross-section of a substrate 805 having a large depression 810 and a small depression 815 within large depression 810. Small depression 815 has protrusion 820 extending into the space to be occupied by molten globule 840. Protrusion 820 can have at least one vertex 825. Instead of, or in addition to, protrusion 820, small depression 815 can have a further depression 830 in the surface of small depression 815. Further depression 830 may have at least one vertex 835. Further depression 830 can also be described as a protrusion of the space to be occupied by molten globule 840 into small depression 815. Depression 815 may have any number or combination of protrusions 820 and further depressions 830. Vertexes 825 and 835 can form a nucleation site for initiating the crystallization of molten globule 840. Once molten globule 840 is crystallized, protrusion 820 and further depression 830 can contribute to physically securing the crystallized island into depression 815, and in turn securing the crystalline island to substrate 805.

The securing means discussed in relation to FIGS. 7 and 8 can also be used in a single-stage depression such as depression 310 shown in FIG. 3. In addition to these means of physically securing the crystalline island to the substrate, surface adhesion can also be used to secure the crystalline island to the substrate. For example, if the molten globule has a wetting angle with the substrate of less than about 90°, the molten globule sufficiently wets the substrate surface and contributes to the adhesion of the crystallized island to the substrate surface.

When the particulate island material is in the form of a loose powder, it can be transferred into the depression in the substrate using means including but not limited to: 1) doctor-blading the powder into the depression; and 2) electrostatically depositing the powder into the depression using charged pins to pick and then deposit the powder into the depression.

When the particulate island material is in the form of a suspension of the particles in a carrier medium, the suspension can be flowed onto the substrate to fill the depression and then squeegeeing the excess suspension located outside the depression from the surface of the substrate. When such a carrier medium is used, during the heating step it can be evaporated, burnt off, or otherwise eliminated before the melting and fusing of the particulate island material.

In the cooling stage, cooling alone can be sufficient to initiate the crystallization of the molten globule. Other techniques can be used to facilitate or more finely control the initiation and progress of the crystallization. For example, the molten globule can be super-cooled below its melting point. Super-cooling can take the form of cooling the molten globule to less than around 300° C. below its melting point before the crystallization starts. Applying a physical impact or shock to the substrate bearing the molten globule can also set off crystallization. This can also be used when the molten globule is super-cooled. In addition, the surface of the molten globule can be exposed to different chemical reactants, such as oxygen, to further guide the crystallization process. The oxygen can form a thin layer or "skin" on the surface of the molten globule which serves to isolate the molten silicon from the substrate and can serve to increase the surface tension of the globule.

Figure 9A:
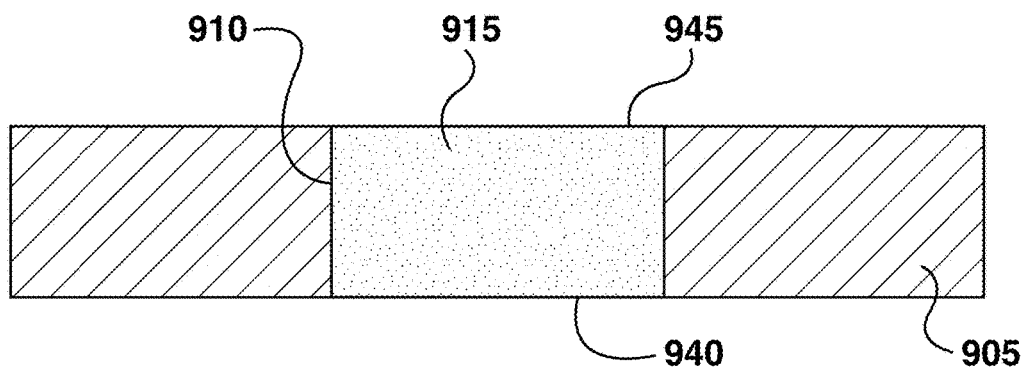
FIGS. 9a-c depict a cross-section of a substrate having a through hole, at different stages of forming a crystalline island in the through hole, according to non-limiting implementations.

FIG. 9a shows an implementation where substrate 905 has a through hole 910 filled with particulate island material 915. Hole 910 has a first end 940 and a second end 945. Hole 910 can be filled with particulate island material 915 using doctor-blading. Hole 910 can also be filled with a liquid suspension comprising the particulate island material dispersed in a carrier medium. The suspension can be flowed onto the substrate and into hole 910, and then the excess suspension located outside hole 910 can be squeegeed off the surface of the substrate. After filling hole 910, substrate 905 and island material 915 can be heated to melt and fuse the island material into molten globule 935. When such a carrier medium is used, during the heating step it can be evaporated, burnt off, or otherwise eliminated before the melting and fusing of the particulate island material. Optionally, substrate 905 can be flipped before the heating. For example, the flipping can be used when hole 910 has a closed end, to point the open end of hole 910 towards the earth's gravitational force.

Figure 9B:
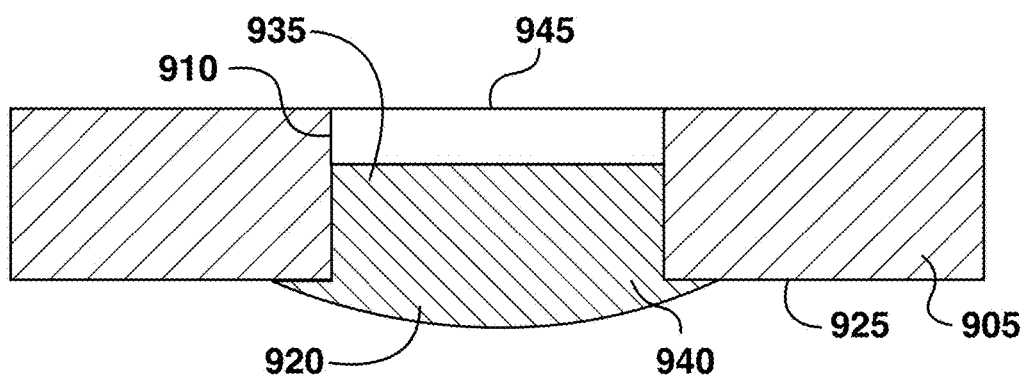
Figure 9C:
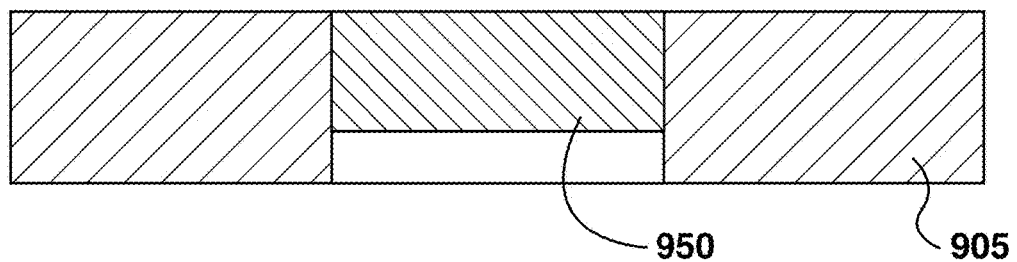

FIG. 9b shows molten globule 935 forming a convex meniscus 920 extending out of the first end 940 of hole 910. Meniscus 920 can form under the force of gravity. In addition, if surface 925 of substrate 905 adjacent first end 940 of hole 910 has a low wetting angle with the molten globule 935, this can encourage the molten globule 935 to wet the surface 925 of substrate 905 and for the meniscus 920 to form and extend out of first end 940 of hole 910. Furthermore, molten globule 930 can be encouraged to extend out of hole 910 and form meniscus 920 if pressure is applied against the molten globule 935 through the second end 945 of hole 910 to push molten globule 935 out of first end 940 of hole 910. As shown in FIG. 9c, once molten globule 935 crystallizes, meniscus 920 can be polished and/or planarized to expose a cross-section of crystalline island 950 and to form a crystalline island 950 in substrate 905.

FIGS. 9a-c show one hole 910, but a plurality of holes can be used. The holes can be arranged in an ordered array. Crystalline islands can be secured to substrate 905 by respective holes, such as hole 910, enveloping and physically securing the respective island 950 and/or the surface adhesion of the crystalline island 950 to the surface of hole 910. Adhesion can be stronger when the wetting angle between the molten globule 935 and the surface of hole 910 is smaller than about 90°.

In another implementation (not shown), particles of island material can be dispersed in a carrier medium to form a suspension. The suspension can then be transferred onto the substrate. Next, the substrate and the suspension can be heated, which can evaporate, burn off, or otherwise eliminate the carrier medium. The heating can also melt and fuse the particles of the island material to form a molten globule. The cooling and securing can be carried on as previously described. A wetting angle of less than about 90° between the molten globule and the substrate can contribute to stronger adhesion between the substrate and crystalline island and to securing the crystalline island to the substrate.

The suspension can be transferred to the substrate using techniques including, but not limited to, one or more of stamping, screen printing, or inkjet printing of the suspension onto the substrate following procedures known in the art. The suspension can also be spin-coated to form a layer on the substrate. This layer can then be lithographically patterned to define one or more regions on the substrate where particles of the island material are present, and other regions where island material particles are absent.

There may not be any depressions in this implementation. However, the substrate surface can be patterned to have areas of higher wetting angle and other areas of lower wetting angle with the molten globule. The molten globule will tend to form on the areas of lower wetting angle. The patterning of areas with low wetting angle can serve as a means of further locating the molten globule, and thus the crystalline island on the substrate. This can be applied to one crystalline island or a plurality of crystalline islands. Methods for patterning a substrate to have high and low wetting angle areas are well known in the art, and can include applying a patterned mask to the surface followed by subjecting the unmasked areas to chemical modification or deposition of other materials, such as $SiO_2$, on the unmasked areas.

Figure 10:
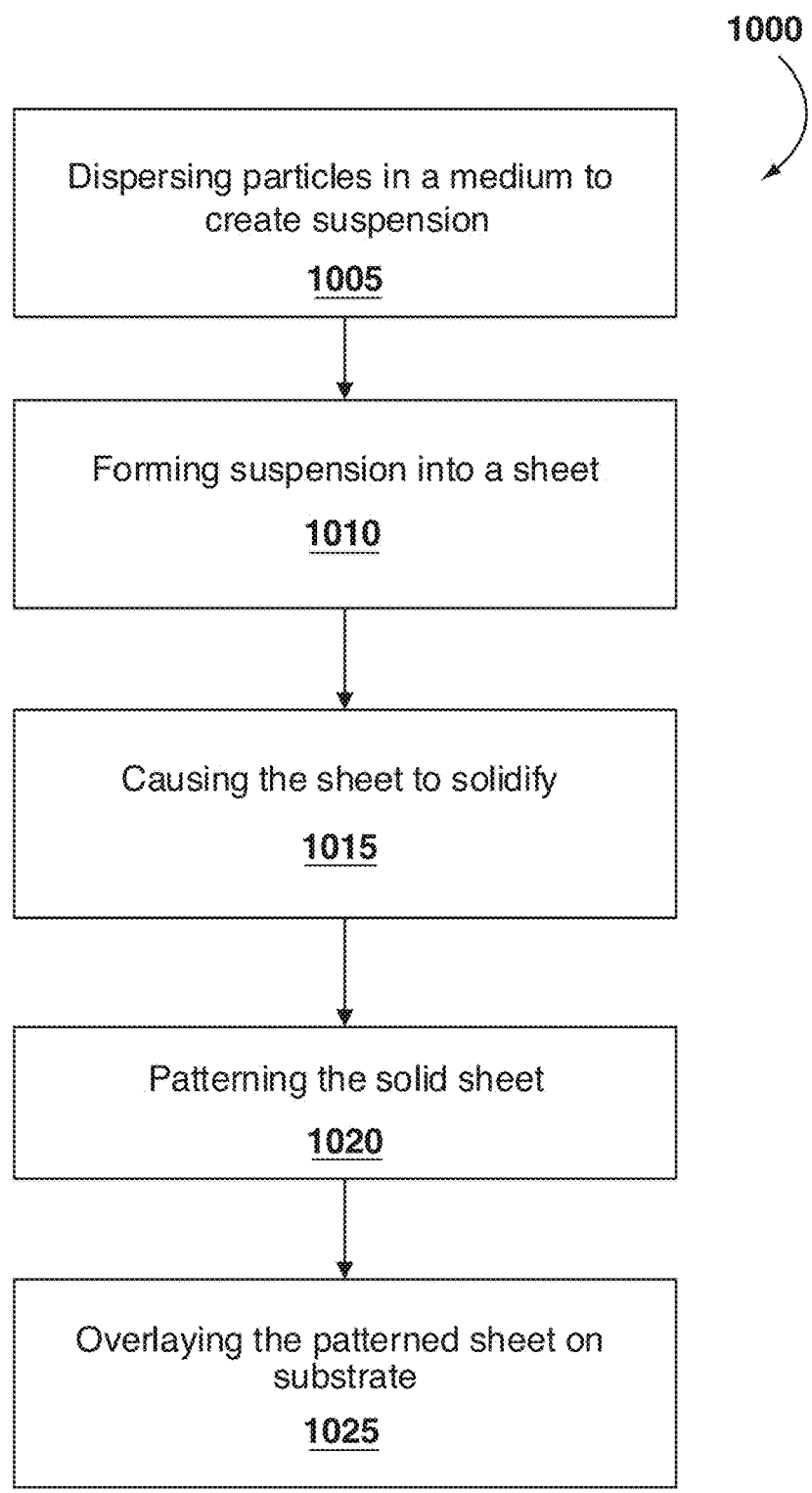
FIG. 10 depicts a method of depositing particles of an island material on a substrate, according to non-limiting implementations.

FIG. 10 shows a further implementation of the present invention reflected in method 1000 for depositing particles of the island material on the substrate. First, as shown in box 1005, the particles can be dispersed in a carrier medium to create a suspension. Next, as shown in box 1010, the suspension can be formed into a sheet by spreading or spin coating the suspension or using other methods known in the art. Next, as shown in box 1015, the sheet of the suspension can be transformed into a solid sheet. This can be accomplished by drying, baking, cross-linking, or otherwise solidifying the suspension. Next, as shown in box 1020, the solid sheet can be patterned by cutting away or removing one or more portions of the sheet to form a patterned sheet. The pattern can be applied using a mechanical punch, lithographically, or using other means known in the art. Next, as shown in box 1025, the patterned sheet can be overlaid on the substrate.

At this stage the remaining steps of heating and cooling-and-securing can be applied as previously described. During heating, the carrier medium can be evaporated, burnt off, or otherwise eliminated before melting and fusing of particles of the island material. A wetting angle of less than 90° between the molten globule and the substrate can contribute to adhesion of the crystalline island to the substrate. This implementation can be used to make a single island or a plurality of crystalline islands on the substrate, which can be arranged in an ordered array.

In the implementations where there is no depression, initiation of the crystallization of the molten globule can still be guided and controlled. One or more guiding depressions into and/or guiding protrusion from the substrate surface coming into contact with the molten globule can initiate crystallization. These guiding depressions and protrusions can have at least one vertex to provide an initiation point for the crystallization process.

Alternatively, the shape of the contact area of the molten globule with the substrate can be controlled to provide an initiation point for crystallization. By patterning the relatively low and high wetting angle areas on the substrate, the molten globule can be made to wet or contact the substrate along a patterned lower wetting angle shape while avoiding the higher wetting angle areas of the substrate. The shape of the low wetting angle area can be any of the shapes discussed above in relation to FIG. 4. The shape can have at least one vertex to provide an initiation point for the crystallization.

Another means of controlling initiation of crystallization can be depositing a metallic grid on the substrate, at least over the areas of the substrate that come into contact with the molten globule. The deposited metal can act as an initiation point for the crystallization of the molten globule. The grid can be made of other materials, such as refractories or Ni. The deposited material can have other shapes such as dots or other patterns of deposited material that may not constitute a grid.

Figure 11:
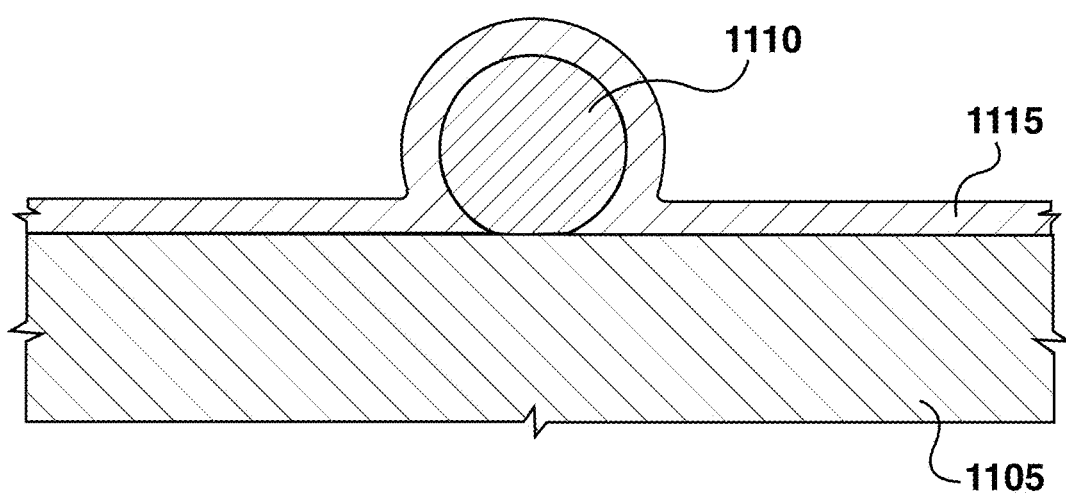
FIG. 11 depicts a cross-section of a crystalline island on a substrate, both over-coated, according to non-limiting implementations.

In other implementations, after the crystalline islands form, the islands and the substrate can be over-coated. FIG. 11 shows a cross-section of substrate 1105 and crystalline island 1110 over-coated with layer 1115. This assembly forms a stack where the crystalline island 1110 is sandwiched between substrate 1105 and cover-coating layer 1115. The stack can then be planarized to remove some of the material comprising the stack and expose a cross-section of the crystalline island.

Figure 12:
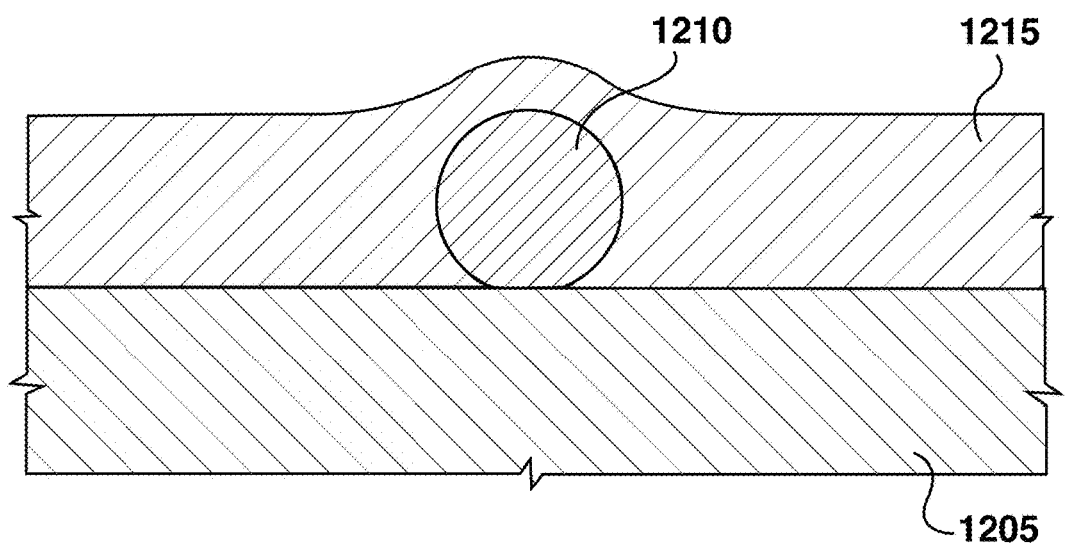
FIG. 12 depicts a cross-section of a crystalline island on a substrate, both over-coated, according to non-limiting implementations.

The over-coating layer 1115 can be deposited using any suitable physical or chemical deposition method including but not limited to spin coating or electrostatically-applied powder coating. The layer can be a thin layer, such as layer 1115 in FIG. 11, or can be a thicker layer such as layer 1215 shown in cross-section in FIG. 12. When an over-coating layer is used, it can physically secure the crystalline island to the substrate by sandwiching the crystalline island between the substrate and the over-coating layer, as shown in FIGS. 11 and 12. This securing action of the over-coating layer can contribute to securing to the substrate crystalline islands having a large wetting angle, and therefore small contact area, with the substrate. Large wetting angles can, for example, be angles greater than about 90°. Over-coating can be applied to a plurality of islands on a substrate.

Figure 13:
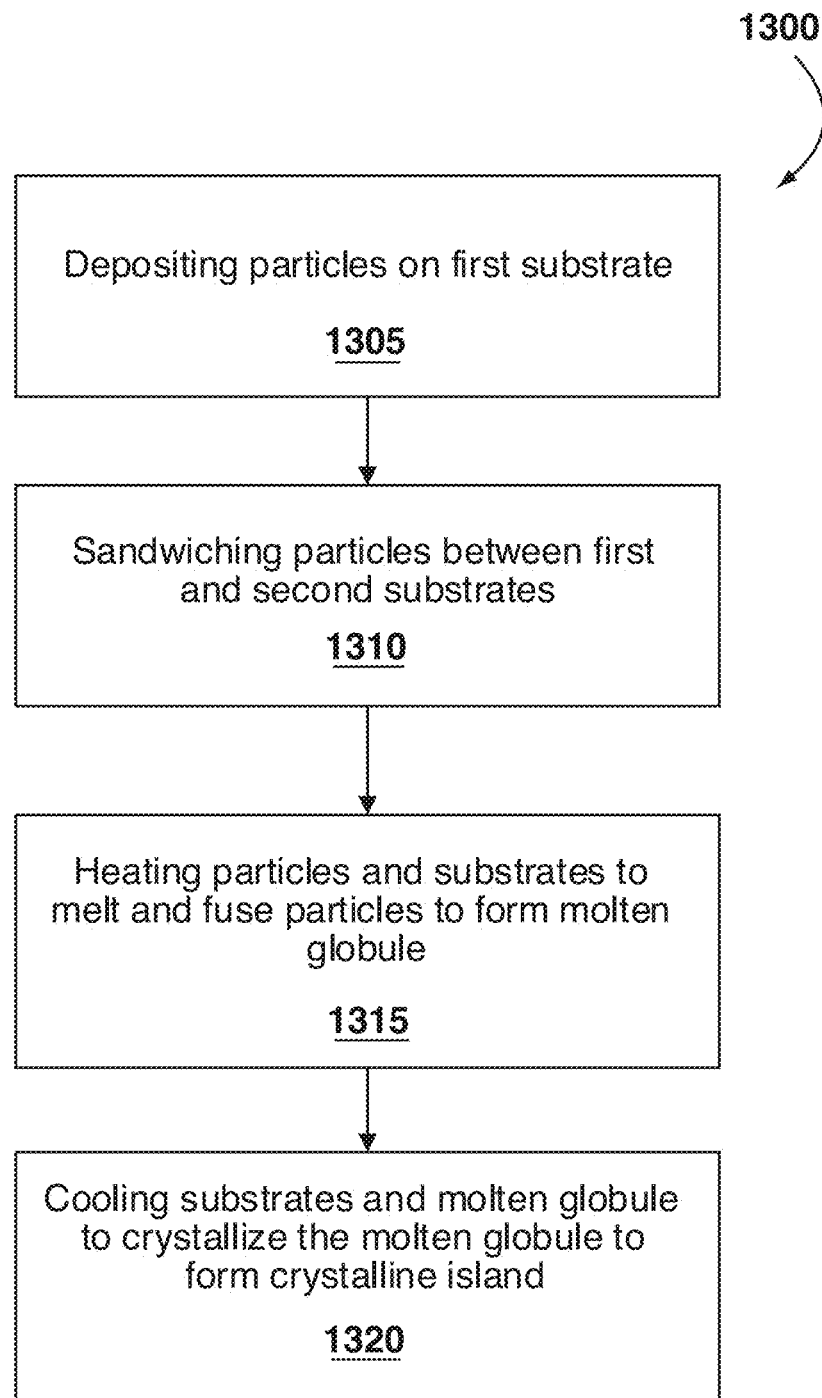
FIG. 13 depicts a method of fabricating a crystalline island sandwiched between two substrates, according to non-limiting implementations.

Another implementation of the present invention is reflected in method 1300 shown in FIG. 13. Box 1305 shows depositing particles of an island material on a first substrate. Particles can be deposited as loose powder or in a suspension as described above. The deposition can be patterned and/or at specified locations relative to the substrate. Next, as shown in box 1310, the particles of the island material can be sandwiched between the first substrate and a second substrate placed adjacent the first substrate. Next, as shown in box 1315, the substrate and the particles can be heated to melt and fuse the particles into a molten globule, without melting the first substrate or the second substrate.

When the particles are deposited as a suspension in a carrier medium, the heating step can evaporate, burn off, or otherwise eliminate the carrier medium before melting and fusing the particles. Next, as shown in box 1320, the substrates and the molten globule can be cooled to crystallize the molten globule, thereby forming a crystalline island.

Figure 14:
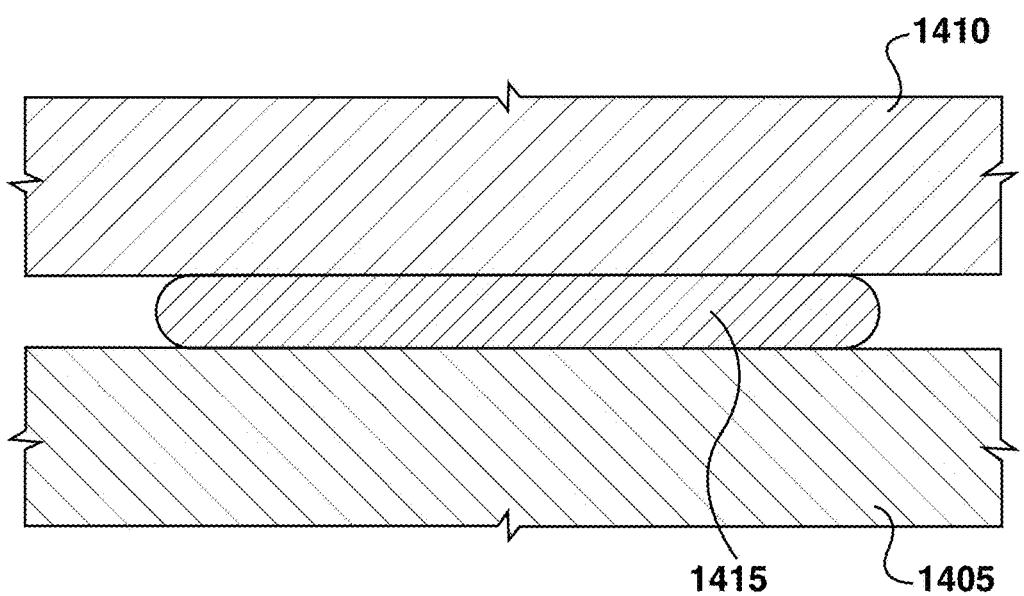
FIG. 14 depicts a cross-section of a molten globule sandwiched between two substrates, according to non-limiting implementations.

The sandwiching, described in box 1310, and the heating described in box 1315 can be performed in the opposite order, i.e. the molten globule can form before it is sandwiched between the first and the second substrates. FIG. 14 shows molten globule 1415 sandwiched between first substrate 1405 and second substrate 1410.

When the wetting angle between molten globule 1415 and both first substrate 1405 and second substrate 1410 is large, the crystallized island can adhere more weakly to the substrate. The weak adhesion can facilitate removing the crystallized island from the substrate to form a free-standing wafer.

Figure 15:
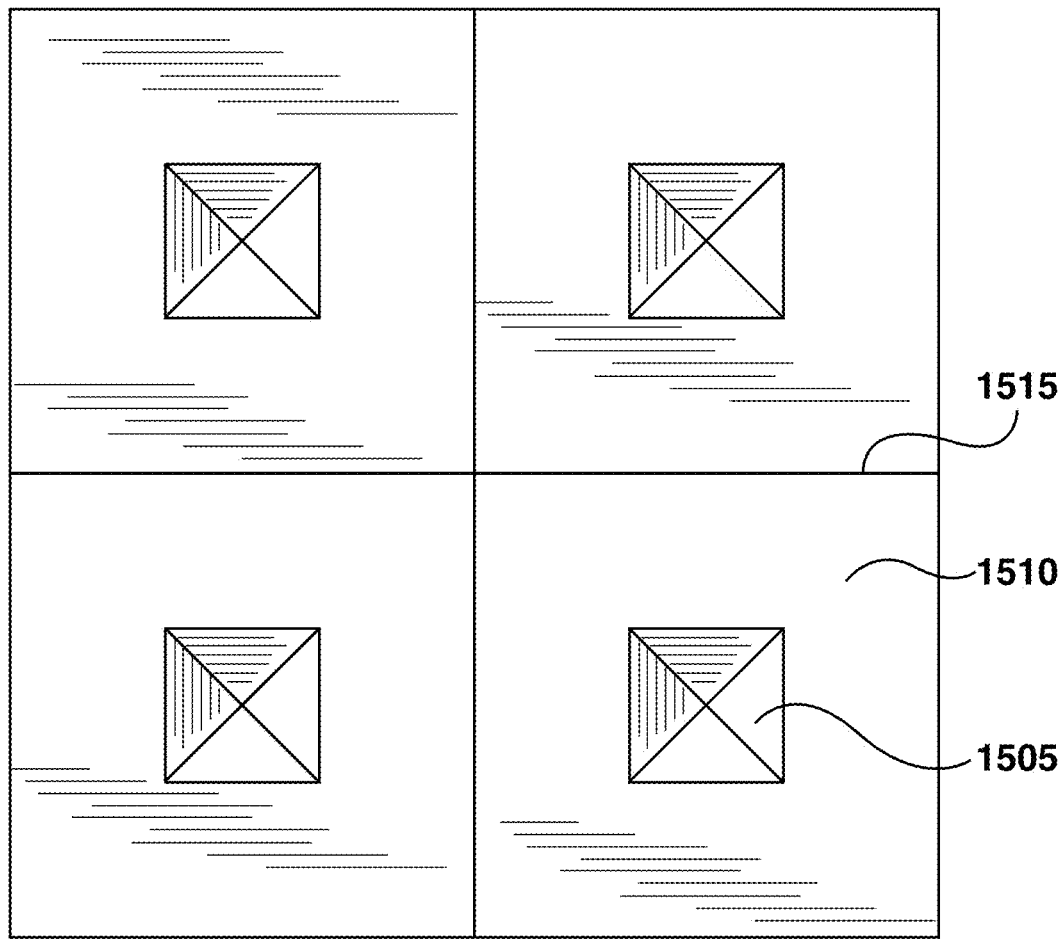
FIG. 15 depicts a top plan view of an array of pyramids and abutting crystal grains on a substrate, according to non-limiting implementations.

Features on the surfaces of one or both of the first and second substrates can be used to initiate crystallization of the molten globule. FIG. 15 shows an array of pyramids 1505 that can be formed on the region of the substrate that comes into contact with the molten globule. Pyramids 1505 can protrude from the substrate surface or form depressions into the substrate surface. Instead of a pyramid, other shapes can be used, such as a cone. These shapes can have a vertex, as does pyramid 1505, to act as an initiation site for the crystallization of the molten globule.

Each pyramid 1505 initiates crystallization to form grain 1510, which eventually abuts upon neighboring grains at grain boundaries 1515. Using this method, a molten globule can be patterned into a poly-crystalline form. As discussed above, during crystallization at least some of the impurities in the molten globule can be pushed towards the grain boundary regions. This process can leave the central region of grain 1510 with relatively fewer impurities yielding a higher quality crystal for post-processing, such as device fabrication on grain 1510. This process can isolate the grain boundaries to regions where devices will not be fabricated in subsequent processing. Although FIG. 15 shows four grains 1510 of uniform size, grains 1510 can also be of different sizes.

Figure 16:
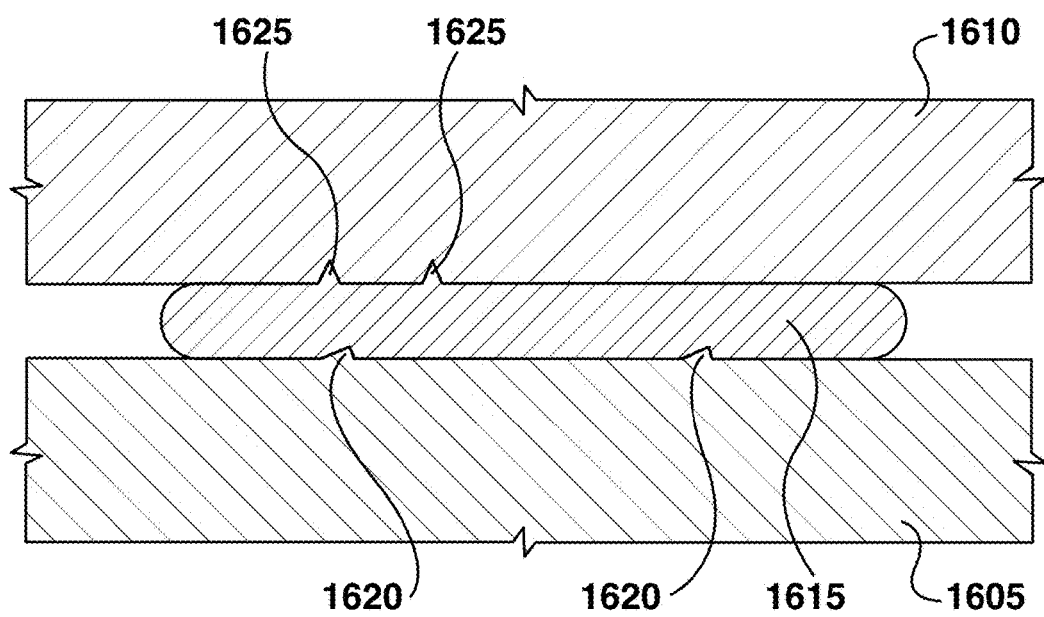
FIG. 16 depicts a cross-section of a molten globule sandwiched between two substrates, according to non-limiting implementations.

FIG. 16 shows a cross-section of molten globule 1615 sandwiched between two substrates 1605 and 1610. As discussed above, one or both of the substrates can include depressions or protrusions to guide the crystallization process. Substrate 1605 can have protrusions 1620 in contact with molten globule 1615. Substrate 1610, in turn, can have depressions 1625 in contact with molten globule 1615. The protrusions 1620 and depressions 1625 can be of different shapes and any numbers of them can be used in/on one or both of first substrate 1605 and second substrate 1610. In addition or instead of protrusions and depressions, a grid or array of a metal or other material deposited on one or both of the first and the second substrate where those substrates come into contact with the molten globule can also be used to initiate and guide the crystallization process.

The cooling as shown in box 1320 of FIG. 13 can also include super-cooling the molten globule. The super-cooling can include cooling the molten globule to a temperature below about 300° C. below its melting point before crystallization begins. A pressure pulse or mechanical impact can also be applied to the molten globule in a super-cooled state or otherwise. A seed crystal can also be added to the molten globule in a super-cooled state or otherwise.

In some implementations, the coefficient of thermal expansion (CTE) of the substrate at a temperature within about 20° C. of the melting point of the island material can be matched to the CTE of the island material at the melting point of the island material. This matching of CTE can reduce stresses between the island material and the substrate as each one cools and contracts. Lower stresses can facilitate making of higher quality crystals with fewer defects, and can improve the adhesion of the crystalline island to the substrate.

The island material can include, but is not limited to, semiconductors. Such semiconductor can include, but are not limited to, silicon. The substrate material can include, but is not limited to, silica, alumina, sapphire, niobium, molybdenum, tantalum, tungsten, rhenium, titanium, vanadium, chromium, zirconium, hafnium, ruthenium, osmium, iridium, and combinations and alloys of these materials.

The substrate can also be a ceramic or glasses with sufficiently high melting or softening temperatures. The substrate can also be a High-Temperature Co-fired Ceramic (HTCC). HTCC can be worked and mechanically patterned in its green phase. When the island material is silicon, alumina can be a relatively higher wetting angle material and silica a relatively lower wetting angle material.

In some implementations, the molten globule of the island material can have a flattened or disk shape. For example, referring to FIG. 1, at step 110 heating the substrate and the particles of the island material can melt and fuse the particles to form a molten disk and/or a molten disk-shaped or flattened globule. At step 115, the cooling can then solidify and crystallize the molten disk, thereby securing the disk-shaped crystalline island of the island material to the substrate. The securing can comprise the crystalline island adhering directly to the substrate. In addition and/or instead, the securing can comprise the crystalline island adhering indirectly to the substrate by adhering to any intermediate and/or interfacial layer secured directly to the substrate. In some implementations, some portions of the crystalline island can adhere directly to the substrate material while other portions can adhere to an interfacial and/or intermediate layer covering at least a portion of the substrate. In some implementations, after the cooling step, at least a portion of the crystalline island can be planarized to expose a cross-section of the crystalline island.

Figure 17A:
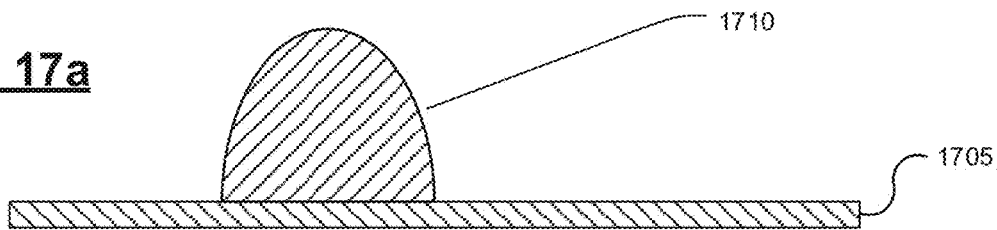
FIGS. 17a-d depict in cross-section various stages of fabricating a crystalline island on a substrate, according to non-limiting implementations.

FIGS. 17*a*-*d* show various steps of an exemplary method for fabricating crystalline islands that are disk shaped and/or have a flattened shape. FIG. 17*a* shows island material 1710 being deposited on a substrate 1705. Substrate 1705 can be similar to the other substrates described herein, and island material 1710 can likewise be similar to other island materials described herein.

While FIG. 17*a* shows island material 1710 deposited as a heap or mound, it is contemplated that island material 1710 can be deposited in any other suitable manner. For example, island material 1710 can be deposited in powder form. When island material 1710 is deposited in powder form, the powder can be deposited through a screen to form one mound or an array of mounds of powder at predetermined positions on substrate 1705. The size of the openings in the screen can determine the shape and size of the mounds of powder on substrate 1705.

In other implementations, island material 1710 can be deposited as a layer of material on the substrate. In yet other implementations, the island material 1710 can be suspended in a carrier medium, and the suspension can be deposited on substrate 1705. Such layers and/or suspensions of island material 1710 can be patterned on substrate 1705 and/or deposited at predetermined positions on substrate 1705. In some implementations, island material 1710 can be printed on substrate 1705.

Figure 17B:
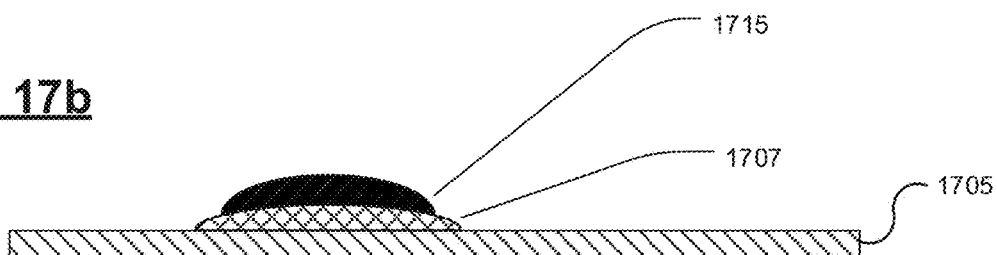

Referring to FIG. 17*b*, once island material 1710 is deposited on substrate 1705, island material 1710 and substrate 1705 can be heated to melt island material 1710 to form a first molten disk 1715. The heating can also form a second molten disk 1707 disposed between first molten disk 1715 and substrate 1705. Second molten disk 1707 can comprise oxygen and the island material.

The molten disks can have any generally flattened shape, including but not limited to, a saucer, a pancake, a wafer, a platelet, a discus, a sheet, and/or an oblate shape. The molten disks can have a maximum thickness that is at least about ten times smaller than the smaller of their maximum length and maximum width. In some implementations, molten disks can have a maximum thickness that is at least about five times smaller than the smaller of their maximum length and maximum width. In other implementations, molten disks can have a maximum thickness that is at least about two times smaller than the smaller of their maximum length and maximum width. The first and second molten disks can be largely or entirely immiscible, thereby remaining largely or entirely phase-separated in the molten state. In addition, second molten disk 1707 can have a higher density in the molten state, thereby remaining, under the force of gravity, between substrate 1705 and first molten disk 1715.

After the heating, substrate 1705, first molten disk 1715 and second molten disk 1707 can be cooled to solidify and/or crystallize first molten disk 1715 to form the crystalline island of the island material. In this process, second molten disk 1707 can also solidify to form an oxide disk. The crystalline island can also have a disk like (or generally flattened) shape similar to the shape of first molten disk 1715.

The crystalline island can be single, poly, and/or nano crystalline. In some implementations, after forming the crystalline island, at least a portion of the crystalline island can be planarized to expose a cross-section of the crystalline island. In some implementations, the island can be mechanically (and/or chemo-mechanically) planarized without becoming detached from the substrate. This can be made possible because the crystalline island can adhere strongly to the oxide disk, which in turn can adhere strongly to the substrate.

Several factors can contribute to the strong adhesion of the crystalline island to the substrate. One such factor can be the relatively small wetting angle and thereby relatively large contact area between the crystalline island and the oxide disk and also between the oxide disk and the substrate. If either one of the crystalline island and the oxide disk were to have a large wetting angle, and thereby a tendency to ball-up into a near-spherical shape, there would be much smaller contact area, and weaker adhesion, between the crystalline island, the oxide disk, and the substrate. Such balled-up, near-spherical crystalline islands can adhere only weekly to the substrate such that they would become detached from the substrate during planarization, such as mechanical and/or chemo-mechanical planarization.

Another factor contributing to the strong adhesion can be porosity of the substrate, which can also increase the contact surface area between the substrate and the oxide disk and/or crystalline island in contact with the substrate. Yet another factor contributing to the strong adhesion of an alumina substrate to an oxide layer comprising silicon oxide is that often alumina substrates comprise some glass mixed in with the aluminum oxide. Since most glass comprises silicon oxide, the glass component of the alumina substrate can adhere strongly to the oxide disk which can also comprise silicon oxide.

Figure 17C:
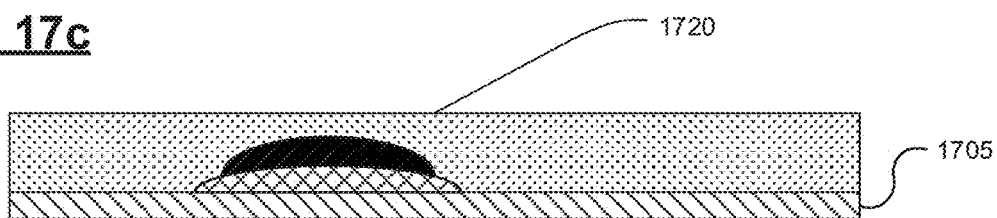
Figure 17D:
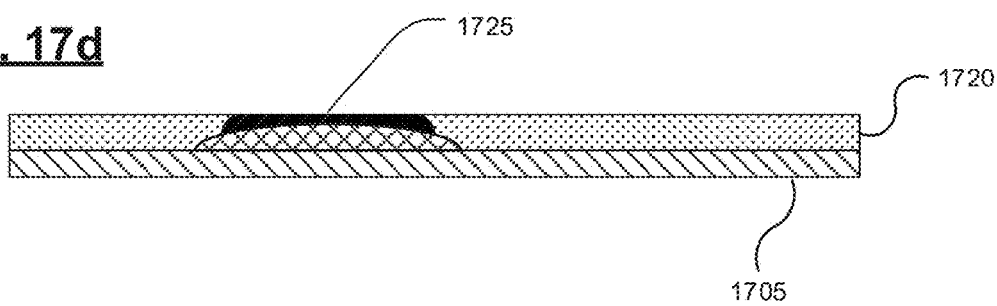

In some implementations, as shown in FIG. 17*c*, after the cooling the crystalline island and substrate 1705 can be over-coated with an over-coating layer 1720 to form a stack. This over-coating layer 1720 can be similar to other over-coating layers described herein. As shown in FIG. 17*d*, after the over-coating, the stack can be planarized to remove portions of the over-coating layer and the crystalline island, and as a result expose a cross-section 1725 of the crystalline island.

In some implementations, second molten disk 1707 can be formed when island material 1710 is heated on substrate 1705 in the presence of oxygen. For example, oxygen can be present in gaseous form if island material 1710 and substrate 1705 are headed in an air atmosphere. In some implementations, second molten disk 1707 can comprise a molten oxide of the island material which phase separates from first molten disk 1715 comprising molten island material.

The presence of the second molten disk, combined with temperatures in excess of island material's melting point during the heating step, can allow the molten globule of the island material to spread into a disk, instead of balling-up into a near-sphere under surface tension forces. Such temperatures can also reduce the viscosity of the molten island material, thereby promoting the ability of the molten island material to spread into a molten disk. In addition, the second molten disk can allow the first molten disk to cool and solidify into a disk and/or flattened shape. Without the second molten disk, as the temperature is reduced to approach the melting point of the island material, the decreasing temperature can cause an increase in the surface tension of the molten island material, thereby causing it to ball-up into a near-sphere.

Moreover, the second molten disk can allow the first molten disk to crystallize into a crystalline island while minimizing interference with crystal formation during the cooling step due to lattice and/or CTE mismatches between the island material and the substrate. Reducing these interferences and/or mismatches can also strengthen the mechanical adhesion of the crystalline island, via the oxide disk, to the substrate.

In one particular example, crystalline islands of silicon can be fabricated on an alumina substrate. The alumina substrate can comprise Alumina Ceramic Substrate 10×10× 0.5 mm, one side polished (ALCeramic101005S1) sold by MTI Corporation. Particles of silicon can be deposited as heaps onto the alumina substrate. The deposition can be carried out using a screen with holes having a diameter of about 1 mm. Then the alumina substrate and the heaps of silicon island material can be heated in an air atmosphere, according to the temperature profile summarized in Table 1 below:

TABLE 1

Temperature Profile

| Step | Ramp rate (° C./min) | Level temp (° C.) | Dwell time (min) |
|---|---|---|---|
| 1 | 3 | 1000 | 0.1 |
| 2 | 10 | 1600 | 60 |
| 3 | 10 | 1200 | 0.1 |
| 4 | 5 | 500 | 0.1 |

As can be seen in Table 1, the maximum temperature is 1600° C., which is in excess of the melting point of silicon, which is 1414° C. In other implementations, the maximum temperature can be at least about 1500° C. In the case of silicon deposited on alumina, flattening of the first molten globule into the first molten disk, and consequent formation of a flattened/disk shaped crystalline islands has not been observed at temperatures below 1500° C. At the conclusion of step 4 in the temperature profile, the heater can be turned off, and the sample can be allowed to cool further to facilitate subsequent handling.

In addition, while the dwell time at 1600° C. is 60 minutes, dwell times as short as at least 5 minutes at 1600° C. can cause flattening of the molten island material into the first molten disk, and consequent formation of a flattened/ disk shaped crystalline island. Generally, in some implementations, the maximum temperature can be at least about 86° C. above the melting point of the island material. In other implementations, the maximum temperature can be at least about 186° C. above the melting point of the island material.

Figure 18:
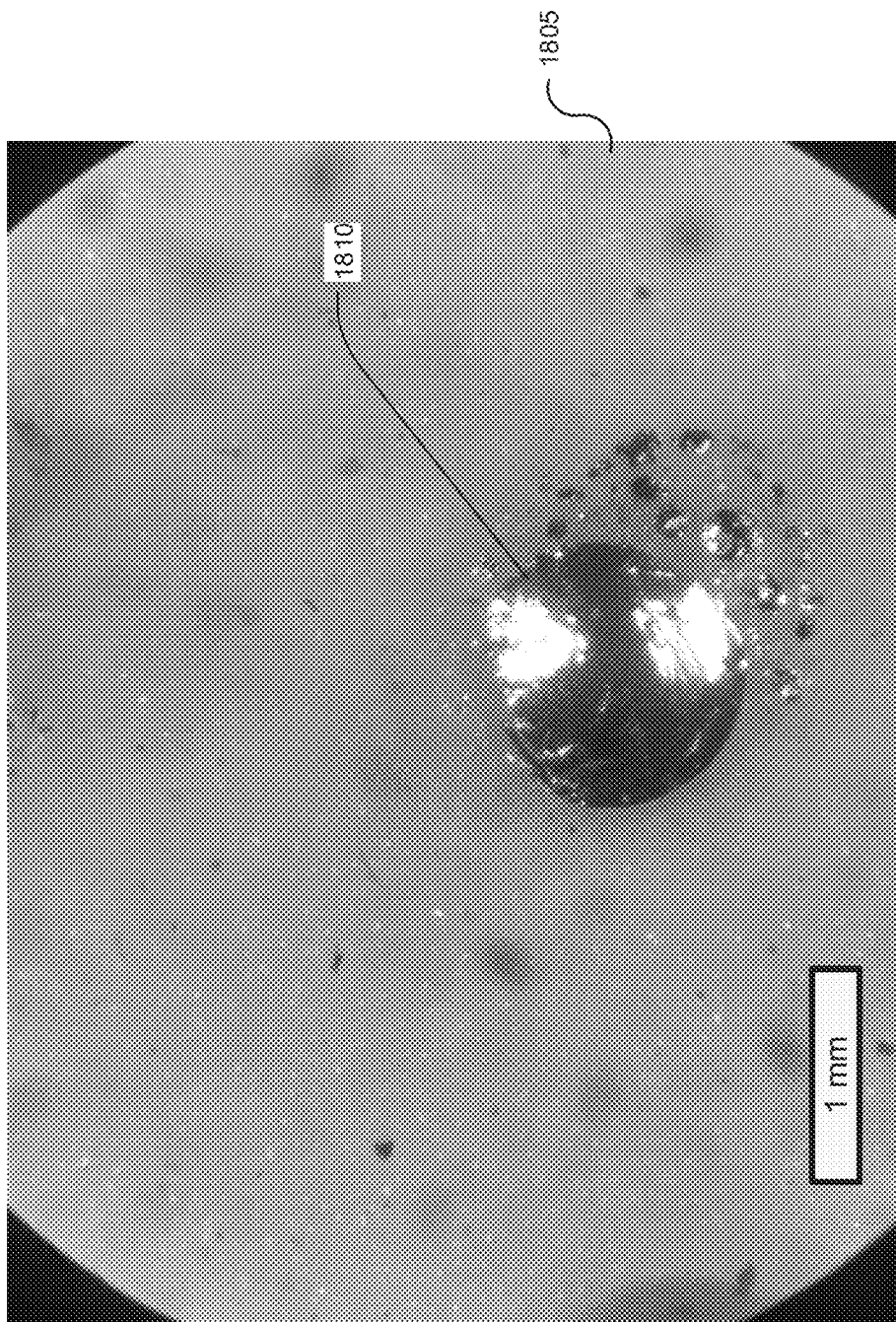
FIG. 18 depicts a photomicrograph of a crystalline island on a substrate, according to non-limiting implementations.

FIG. 18 shows a top plan view optical micrograph of a flattened/disk shaped island 1810 of silicon formed on an alumina substrate 1805, fabricated using the temperature profile summarized in Table 1. When the island material comprises silicon and the substrate comprises alumina, in some implementations the second molten disk, and the oxide disk into which it solidifies, can comprise aluminum in addition to oxygen and silicon. In some implementations, this aluminum can originate from the alumina substrate. In general, in some implementations, the second molten disk can comprise one or more elements originating from the substrate.

In the implementations described above, the second molten disk, and the oxide disk into which it solidifies, are formed by heating in the presence of oxygen the island material deposited on the substrate. It is also contemplated that in some implementations an oxide layer can be formed on the substrate before the island material is deposited on the substrate. This oxide layer can comprise the island material and oxygen. In other implementations, the oxide layer can also comprise additional materials including, but not limited to, elements originating from the substrate.

In implementations where the oxide layer is initially formed on the substrate, the depositing step can comprise depositing the island material on the oxide layer. In such implementations, the second molten disk can comprise the oxide layer in a molten state. In some implementations, forming the oxide layer can comprise depositing on the substrate the oxide layer, which can comprise an oxide of the island material. In some implementations, the depositing can be according to a predetermined pattern, for example using a mask, printing, lithography, and the like.

In other implementations, forming the oxide layer can comprise depositing an initial amount of the island material on the substrate and then oxidizing this initial amount of the island material to form the oxide layer. The deposition of the initial amount of the island material can be according to a predetermined pattern. The initial amount of the island material can be deposited as particles or as a layer of the island material. For example, in the case of silicon island material, the initial amount can be deposited as silicon particles/power and/or as a layer of amorphous, nano-crystalline, and/or poly-crystalline silicon.

In implementations where the oxide layer is formed on the substrate prior to depositing the island material on the oxide layer, no further oxide needs to be formed during the heating step. As such, the heating can be performed in a non-oxidizing atmosphere. For example, the atmosphere can be substantially oxygen-free. In some implementations, an inert atmosphere can be used during the heating. For example, the heating can be performed in an argon atmosphere.

In some implementations, the island material can be deposited on the substrate in a predetermined pattern. This pattern can comprise an interconnected and/or contiguous pattern, including but not limited to the shape of a plurality of interconnected nodes, with each node connected to one or more other nodes. This can allow for the crystallization of the molten island material to start at one, or a few, nucleation sites in the pattern and then proceed throughout the pattern.

This mode of crystallization can allow subsets of the crystalline islands to have similarly oriented crystal lattices. In some implementations, a single crystal can propagate through all or substantially all of the interconnected pattern of the island material. All the means and methods described herein for initiating and/or controlling crystallization can be used to initiate and/or control the crystallization of the molten island material deposited in the predetermined pattern.

While the foregoing describes disks of molten material, it is contemplated that the molten material can be of any generally flattened shape, depending on the pattern according to which the island material and/or the oxide layer is deposited and/or formed on the substrate. For example, if the island material is deposited on the substrate according to a pattern of interconnected nodes, then the heating step can produce a generally flattened layer of molten island material also generally in the shape of interconnected nodes. The molten oxide layer can also be generally in the shape of interconnected nodes. Moreover, once the layer of molten island material crystallizes, the resulting crystallized island material can also comprise a generally flattened layer in the shape of interconnected nodes.

While the above description relating to FIGS. 17*a-d* and FIG. 18 refers to the molten island material being in the shape of a first molten disk, it is contemplated that the molten quantity of the island material need not be in a flattened or disk shape, and can form into the shape of any bounded and contiguous quantity of molten material, which can have any shape dictated by its material properties such as viscosity and surface tension and by external factors such as gravity and the shape of the container/substrate supporting the molten material. Such shapes can be generally and/or colloquially described as a corpus, body, quantity, glob, blob, globule, dab, and the like. These general and/or colloquial descriptions also include flattened and/or disk shaped quantities of the molten island material.

As such, the molten globule and/or the molten disk of the island material can also be described as a molten corpus of the island material. When the molten corpus is cooled it can solidify to form a crystallized corpus. All or a portion of this crystallized corpus can, in turn, form the crystalline island of the island material.

In some implementations, if the amount and/or volume of the deposited island material is large relative to the footprint of the deposited material on the substrate, then upon heating the volume of the molten island material may be too large for the molten island material to form a flattened or disk shape. Such a larger quantity of molten island material can form a molten corpus that is more rounded, i.e. has a maximum thickness which, relative to its maximum length and maximum width, is larger than the maximum thickness of a flattened or disk shape with the same maximum length and/or maximum width.

Moreover, in some implementations, such a more rounded molten corpus can begin to cool and crystallize from a point distal from the substrate. As the wave of crystallization propagates from this point towards the substrate, the wave can create strain and/or other forces internal to the molten corpus. Other examples of other such forces can include, but are not limited to, strain caused by the differences between the coefficient of thermal expansion (CTE) of the crystalized corpus (and/or cooling and crystallizing molten corpus) and the CTE of the solidified oxide disk (and/or cooling and solidifying molten oxide disk).

These forces can cause a first solid portion distal from the substrate to spontaneously separate or pop-off from the remainder of the cooling and solidified molten corpus that remains attached to the substrate. This remainder, in turn, can form a second solid portion that is proximal to the substrate and forms the crystalline island. In such a scenario, the crystallized corpus is divided into two portions: the first solid portion and the second solid portion. In some implementations, some or all of the separated first solid portions can be collected and recycled/reused as island material.

While the above description of the wave of crystallization refers to the wave starting at a point distal from the substrate, it is contemplated that based on temperature profiles and/or cooling profiles of the components surrounding the molten corpus, in some implementations the wave of crystallization can propagate in the opposite direction, i.e. from a point proximal the substrate towards a point distal from the substrate. In other implementations, the wave of crystallization can propagate in a different direction dictated by the temperature and/or cooling profile of the components surrounding the molten corpus.

So long as the wave and/or pattern of crystallization and/or cooling creates sufficient internal strains/forces between the first solid portion and the second solid portion, these two solid portions can spontaneously separate from one another. It is also contemplated that these internal forces may build up as the molten corpus solidifies and continues to cool, and the internal forces can become large enough to cause spontaneous separation when the crystallized corpus is in the cooling phase.

In some implementations, the surface roughness of the substrate can be patterned in order to guide where on the substrate the molten oxide layer and/or the molten island material layer form. For example, the substrate can be polished and/or roughened according to a predetermined pattern. Regions of the substrate with different surface roughnesses can have different wettability by the molten oxide and/or molten island material. In addition, regions of the substrate with different surface roughnesses can adhere to the oxide layer with different mechanical strengths.

Following the method depicted in FIGS. 17*a-d*, and/or the other similar methods described herein, a semiconductor device can be fabricated. Such a device comprises a substrate and an intermediary disk disposed on the substrate. The intermediary disk can comprise oxygen and an island material. The intermediary disk can comprise the oxide disk. The semiconductor device also comprises an island disk disposed on the intermediary disk. The island disk can comprise the island material, and can be crystalline. The island material can be formed separately from the substrate and then deposited on the substrate. The intermediary disk can be formed by melting and then solidifying the island material on the substrate. As discussed above, in implementations where the oxide intermediary disk is formed during the heating step, the heating and/or melting can be performed in the presence of oxygen and at a maximum temperature exceeding the melting point of the island material.

In addition, while the above description refers to intermediary and island disks, it is contemplated that the intermediary oxide and/or the crystallized island material can be in any layer-like or otherwise flattened shape or configuration. The island disk can have a maximum thickness that is at least about ten times smaller than the smaller of its maximum length and maximum width. In some implementations, the island disk can have a maximum thickness that is at least about five times smaller than the smaller of their maximum length and maximum width. In other implementations, the island disk can have a maximum thickness that is at least about two times smaller than the smaller of their maximum length and maximum width.

In some implementations, the substrate can comprise alumina and/or the island material can comprise silicon. Moreover, in some implementations the intermediary disk can also comprise aluminum. This aluminum can originate from the alumina substrate.

The planarized cross-sections of the crystalline islands can be used to make electronic devices, such as transistors or other circuit components. As such, the methods and devices described herein can be used in backplanes for active matrix displays such as OLED displays, in electro-optical detector arrays such as X-ray detectors, and in fabricating certain integrated circuits such as those used in amplifiers and op-amps.

When multiple crystalline islands are formed on a substrate, and/or when multiple electronic devices are fabricated on a given planarized cross-section, the islands and/or the devices respectively can be appropriately singulated to provide individual crystalline islands and/or electronic devices respectively. When separated crystalline islands (or arrays of crystalline islands) are used to make separate displays and/or detectors, those displays and/or detectors can be tiled together to form a larger tiled display and/or detector.

Figure 19A:
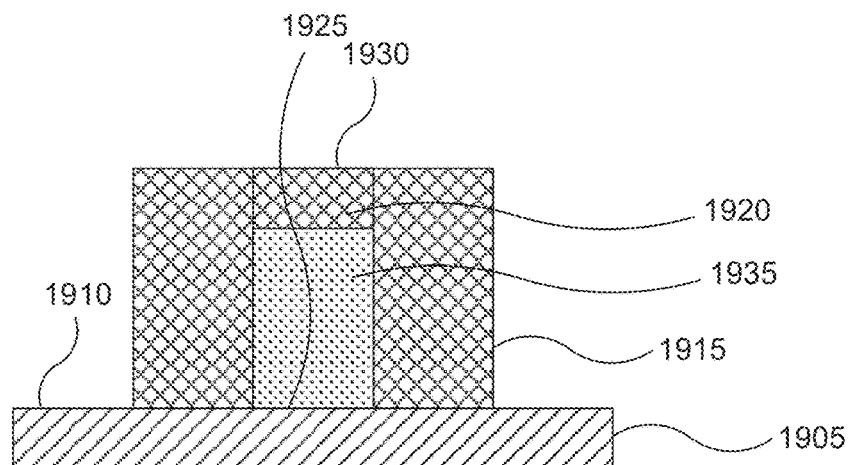
FIGS. 19a-c depict, in side elevation cross-sectional views, various stages of fabricating a crystalline island on a substrate, according to non-limiting implementations.

In some implementations, depositing the island material on the substrate can comprise positioning a template on a surface of the substrate, the template comprising a channel having a first end abutting the surface and a second end opposite the first end. The surface can cap and/or cover the first end. At least a portion of the channel can be filled with the island material, either before or after the template is positioned on the substrate. FIG. 19a shows a side elevation cross-section of a template 1915 positioned on a surface 1910 of a substrate 1905. Template 1915 comprises a channel 1920 having a first end 1925 abutting surface 1910 of substrate 1905 and a second end 1930 opposite first end 1925. A portion of channel 1920 is filled with island material 1935.

Substrate 1905 can be similar to substrate 1705 and/or the other substrates described herein. Template 1915 can be formed of high temperature co-fired ceramic and/or any other suitable material that does not melt during the operational temperatures described herein and would not react with and/or otherwise contaminate the crystalline island in a manner that would render the crystalline island unsuitable for forming electronic devices. Channel 1920 can have any suitable shape and/or cross-section, including but not limited to, a cylindrical shape and/or a circular cross-section.

Figure 19B:
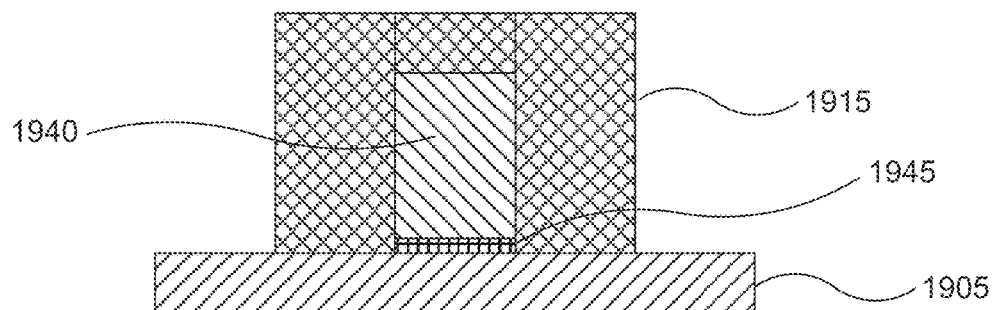

Once template 1915 and island material 1935 therein are on substrate 1905, they can all be heated and then cooled in a manner similar to that described above, which heating can cause island material 1935 to melt to form a molten corpus and then solidify to form crystallized corpus 1940, as shown in FIG. 19b. An oxide layer 1945 can form between substrate 1905 and crystallized corpus 1940. Formation of crystallized corpus 1940 and oxide layer 1945 can be similar to the formation of the crystalline island and the oxide disk described above in relation to FIGS. 17a-d and FIG. 18.

At this point, a portion of template 1915 and crystallized corpus 1940 can be removed, e.g. by chemo and/or mechanical planarization, to expose a crystalline island of the island material. This planarization process is not shown in the figures; however, similar planarization steps are shown in FIGS. 6d and 17d and described in relation thereto. In some implementations, template 1915 can be selectively etched or otherwise selectively removed, and then crystallized corpus 1940 can be planarized.

Figure 19C:
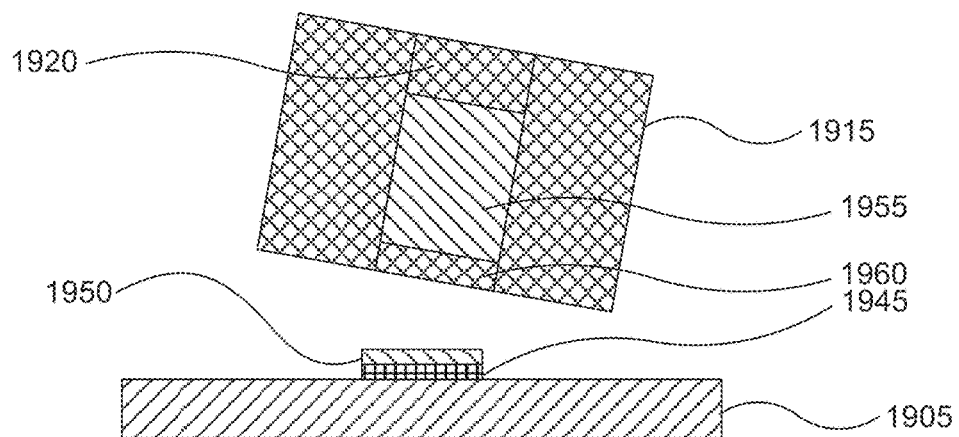

Moreover, referring to FIG. 19c, in some implementations, template 1915 can be removed by lifting template 1915 off from substrate 1905 to create a crystalline island of the island material secured to substrate 1905. In this process, a first portion 1950 of crystallized corpus 1940 can remain on and/or secured to substrate 1905 to form the crystalline island and a second portion 1955 of crystallized corpus 1940 can remain in channel 1920. As template 1915 is lifted off and oxide layer 1945 and first portion 1950 remain on substrate 1905, oxide layer 1945 and first portion 1950 can leave a corresponding space 1960 in channel 1920. Space 1960 can be proximate first end 1925 (shown in FIG. 19a) of channel 1920.

In implementations where template 1915 is lifted off, steps can be taken to reduce stiction between oxide layer 1945 and first portion 1950 and the surface of channel 1920. For example, and without limitation, the material of template 1915 can be selected to reduce the wettability of the channel surface by the molten oxide material and/or the molten island material. In addition, morphology (e.g. roughness) and/or composition of the surface of channel 1920 can be selected to similarly reduce wettability of the channels surface by the molten oxide material and/or the molten island material. Similar steps, and/or other suitable steps, can be taken to reduce stiction between template 1915 and substrate 1905.

Several different methods can be used to cause and/or facilitate the separation of first portion 1950 from second portion 1955: in some implementations, second portion 1955 can spontaneously separate and/or pop-off from first portion 1950 in a manner similar to the spontaneous separation described above. In other implementations, the surface of channel 1920 can comprise a stress concentrator and/or separation initiator (not shown in FIGS. 19a-c) to facilitate the separation of first portion 1950 from second portion 1955.

The stress concentrator and/or separation initiator can comprise a depression into and/or a projection from the surface of channel 1920. Such a stress concentrator can concentrate internal stresses/strains in crystallized corpus 1940 at the point between first portion 1950 and second portion 1955. Such a concentration can facilitate the spontaneous separation described above. Instead and/or in addition, when acting as a separation initiator, such a depression and/or projection can allow a mechanical and/or acoustic impulse applied to template 1915 to crack crystallized corpus 1940 and separate first portion 1950 from second portion 1955. In some implementations, a thermal shock (i.e. rapid change of temperature) can be used instead of and/or in addition to the mechanical and acoustic impulses.

In some implementations, the stress concentrator and/or separation initiator can comprise a region or circumferential band where the surface of channel 1920 is roughened or made jagged. In other implementations, the stress concentrator and/or separation initiator can comprise a pattern of pin-shaped projections projecting from the surface of channel 1920.

While FIGS. 19b-c depict formation of oxide layer 1945, it is contemplated that under different operational conditions, e.g. lower maximum temperatures and/or in the absence of oxygen, there may be no oxide layer, and crystallized corpus 1940 and first portion 1950 can be directly in contact with substrate 1905.

Moreover, while FIG. 19c depicts a smooth border between first portion 1950 and second portion 1955, it is contemplated that this border can be uneven and/or rough. In such a case, first portion 1950 can be planarized to expose a flat and/or smooth cross-section that can be suitable for formation of electronic devices.

In addition, as there is island material remaining (in the form of second portion 1955) in channel 1920 of the lifted-off template 1915, this template can be reused in another heating/cooling cycle to form another crystalline island without necessarily the need to add additional island material to channel 1920. In this manner, template 1915 can function as a multi-use and/or reusable "print head" for forming and/or "printing" multiple crystalline islands on one or more substrates. Moreover, in some implementations template 1915 can comprise multiple channels, which can have various shapes and/or arrangements. Such a multi-channel template can be used to form and/or "print" crystalline islands of correspondingly different shapes and/or arrangements on one or more substrates.

Figure 20A:
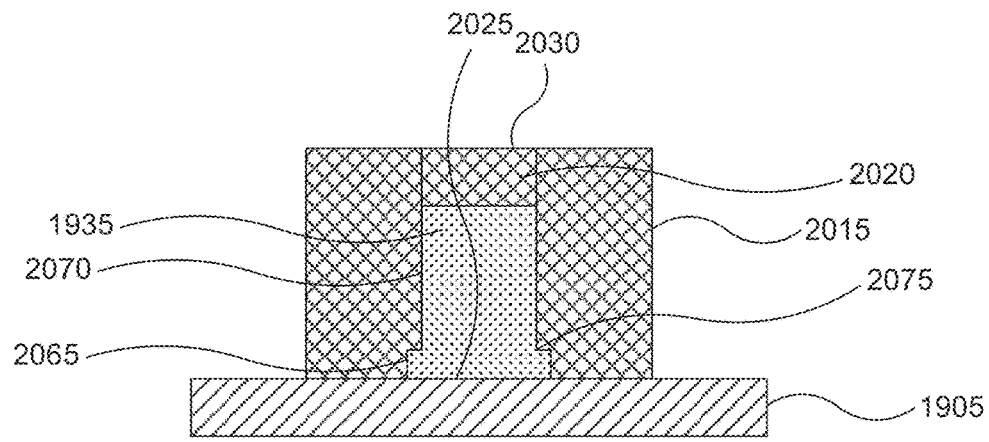
FIGS. 20a-c depict, in side elevation cross-sectional views, various stages of fabricating a crystalline island on a substrate, according to non-limiting implementations.
Figure 20B:
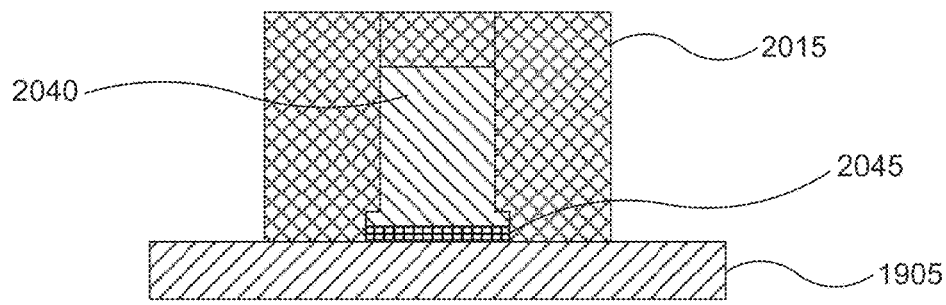
Figure 20C:
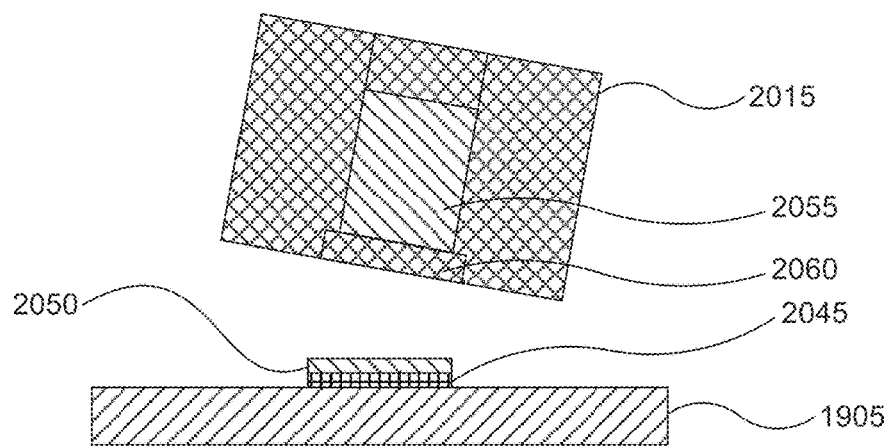

Turning now to FIGS. 20a 20b, and 20c, these figures are generally similar to FIGS. 19a-c, with the difference being that channel 2020 is shaped differently than channel 1920. FIG. 20a shows in side elevation cross-section substrate 1905, and a template 2015 having a channel 2020, which channel 2020 in turn has first end 2025 and second end 2030 opposite first end 2025. Channel 2020 is at least partially filled with island material 1935. Channel 2020 comprises a first region 2065 proximate first end 2025 and a second region 2070 distal from first end 2025. In first region 2065 channel 2020 has a cross-sectional area that is larger than the cross-sectional area of channel 2020 in second region 2070. In other implementations, channel 2020 can have a cross-sectional area and/or shape that is different in any other suitable manner between first region 2065 and second region 2070.

Inner surface of channel 2020 defines a vertex 2075 separating first region 2065 from second region 2070. Vertex 2075 can act as the stress concentrator and/or separation initiator described in relation to FIGS. 19b-c above. While in FIG. 20a vertex 2075 is shown as a right angle, it is contemplated that the vertex can be any other sharp or angular projection from and/or depression into the surface of channel 2020.

Referring now to FIGS. 20b-c, as the cross-sectional area of channel 2020 is larger in first region 2065, template 2015 can form oxide layers 2045 and first portions 2050 (which from the crystalline island) that have a larger area without the need for having a larger cross-sectional area along the full length of channel 2020. After the heating and the cooling, the island material 1935 in channel 2020 melts and then solidifies to form crystallized corpus 2040 and oxide layer 2045.

Subsequently, template 2015 can be removed and/or lifted off, whereby first portion 2050 of crystallized corpus 2040 can remains on and/or secured to substrate 1905 and a second portion 2055 of crystallized corpus 2040 can remain inside channel 2020. As template 2015 is lifted off and oxide layer 2045 and first portion 2050 remain on substrate 1905, oxide layer 2045 and first portion 2050 can leave a corresponding space 2060 in channel 2020.

Figure 21A:
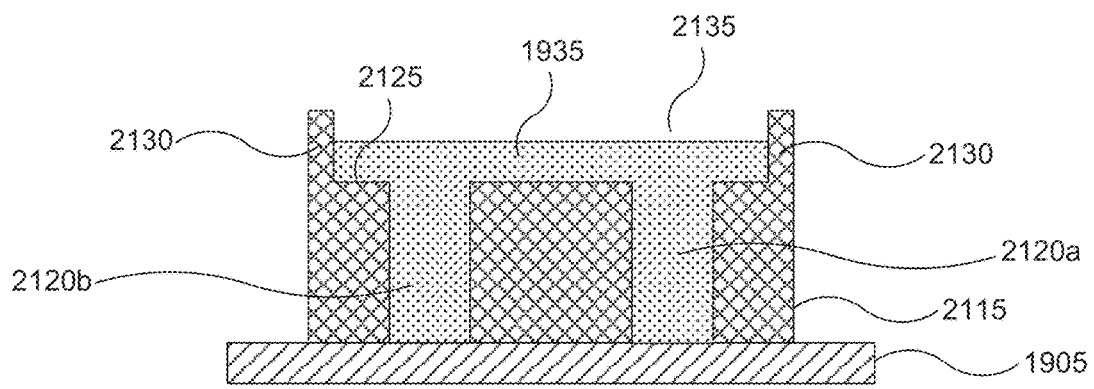
FIGS. 21a-b depict, in side elevation cross-sectional views, various stages of fabricating crystalline islands on a substrate, according to non-limiting implementations.
Figure 21B:
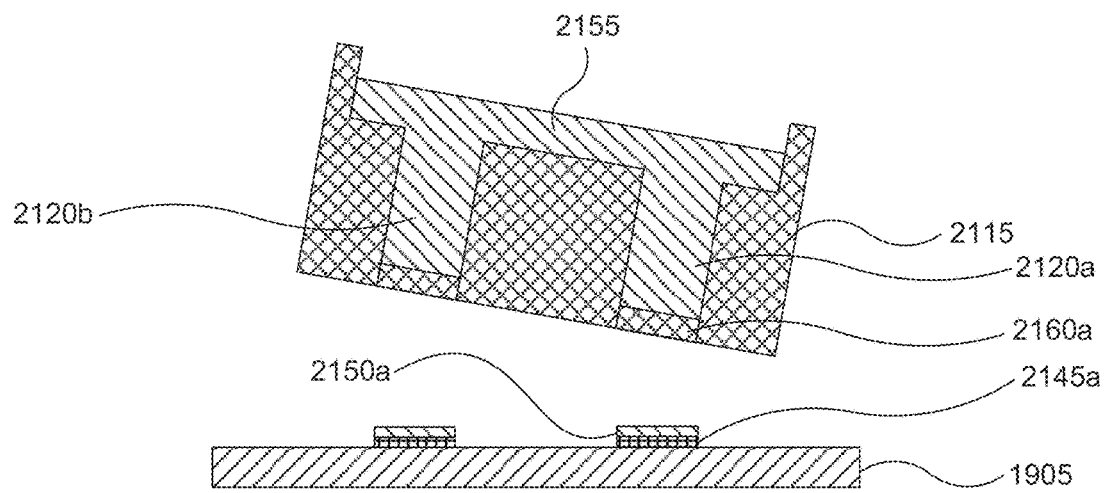

Turning now to FIGS. 21a and 21b, these figures depict select steps in a method of fabricating a crystalline island similar to the steps depicted in FIGS. 19a-c and 20a-c, with the main difference being that the shape of template 2115 is different from the shape of templates 1915 and 2015. Moreover, the process depicted in FIGS. 21a-b can also have a step/state similar to those shown in FIGS. 19b and 20b; however, this step/state is not shown in FIGS. 21a-b for simplicity.

The first difference between templates 1915 and 2015 and template 2115 is that template 2115 comprises two channels 2120a and 2120b. As such, template 2115 can be used to form and/or "print" two crystalline islands at a time. While FIGS. 21a-b show template 2115 as comprising two channels 2120a,b, it is contemplated that in other implementations template 2115 can comprise one or any number of channels, which channels can be arranged in any suitable way.

The second difference between templates 1915 and 2015 and template 2115 is that template 2115 comprises walls 2130 extending from surface 2125 of template 2115 in a direction away from a longitudinal direction of channels 2120a,b. In other words, walls 2130 can extend from surface 2125 of template 2115 in a direction away from the side and/or surface of template 2115 that is configured to come into contact and/or abut substrate 1905. Walls 2130 can be formed integrally with template 2115. Walls 2130 and surface 2125 can cooperate to form a reservoir 2135 configured to store island material 1935. Reservoir 2135 can be in communication with ends of channels 2120a,b such that island material 1935 stored in reservoir 2135 can be transferred into and used to at least partially fill one of more of channels 2120a,b. Island material 1935 stored in reservoir 2135 can allow template 2115 to be used for forming/"printing" a relatively larger number of crystalline islands before additional island material 1935 needs to be supplied from a source external to template 2115.

Referring now to FIG. 21b, after a cycle of heating to melt island material 1935 to form a molten corpus and then cooling the molten corpus to form a crystallized corpus and an oxide layer 2145a, template 2115 can be lifted off from substrate 1905. Upon the lifting off, a first portion 2150a of the crystallized corpus can remain secured to substrate 1905 to form the crystalline island, while a second portion 2155 of the crystallized corpus can remain in template 2115. As template 2115 is lifted off and oxide layer 2145a and first portion 2150a remain on substrate 1905, oxide layer 2145a and first portion 2150a can leave a corresponding space 2160a in channel 2120a. While not numbered or described (for the sake of brevity), as shown in FIG. 21b a similar oxide layer, first portion, and space are also formed corresponding to channel 2120b.

While FIGS. 21a-b show reservoir 2135 having a particular geometry and being integrally formed with template 2115, it is contemplated that in other implementations the reservoir can have any other suitable dimensions, shape, and/or capacity. In addition, it is contemplated that in other implementations reservoir 2135 can be formed using walls and/or other components that are not integrally formed with template 2115, but rather are secured and/or connected to template 2115 and/or to channels 2120a,b. In yet other implementations, the reservoir can comprise a separate container in communication with channels 2120a,b to allow the island material to be transferred from the reservoir to channels 2120a,b.

Figure 22A:
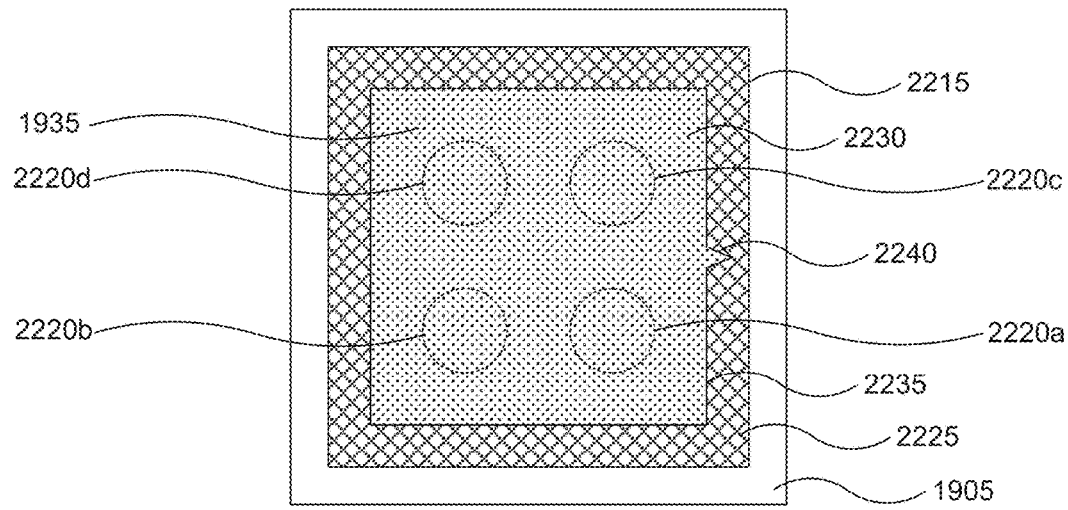
FIGS. 22a-b depict, in top plan views, various stages of fabricating crystalline islands on a substrate, according to non-limiting implementations.
Figure 22B:
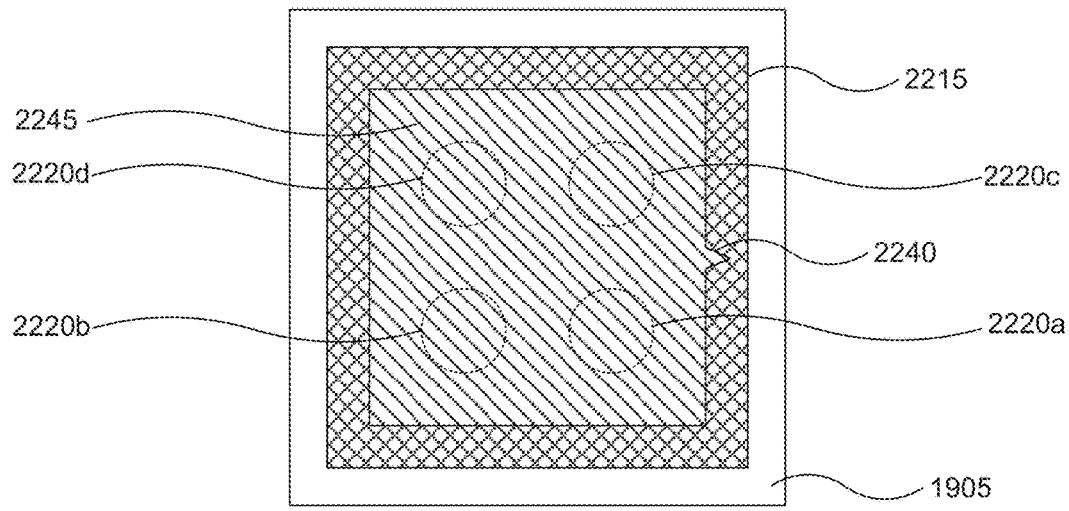

Turing now to FIGS. 22a and 22b, top plan views of a template 2215 are shown resting on substrate 1905. Template 2215 can be generally similar in functionality to template 2115 with one difference being that template 2215 comprises four channels 2220a,2220b,2220c, and 2220d. A circumferential wall 2225 extends from a face of template 2215 in a direction opposite the longitudinal direction of channels 2220a-d. In other words, wall 2225 extends from the top face of template 2215 being the face that is opposite the face configured to abut substrate 1905, and wall 2225 extends in a direction generally away from the face configured to abut substrate 1905.

Wall 2225 cooperates with the top face of template 2215 to form a reservoir 2230 for storing island material 1935. Reservoir 2230 is in communication with channels 2220a-d such that island material 1935 can be transferred from reservoir 2230 into channels 2220a-d to at last partially fill these channels. Walls 2225 have an inner surface 2235 which can come into contact with island material 1935 stored in reservoir 2230. Surface 2235 can comprise a notch 2240 having a sharp vertex.

During the heating, notch 2240 can come into contact with the portion of the molten corpus in reservoir 2230, which molten corpus would be contiguous between reservoir 2230 and channels 2220a-d. During the cooling, notch 2240 and/or its vertex can act as a crystallization initiator allowing the crystallization of the molten corpus to start from a single point and the crystallized corpus to be single crystalline and/or have a uniform crystal orientation. Such uniformity would allow the crystalline islands formed by channels 2220a-d to have the same crystal orientation as one another. As some processes used during the fabrication of electronic devices (e.g. oxide growth) can be dependent on the crystal orientation, uniformity between the crystal orientation of the various crystalline islands can allow for greater uniformity in the fabrication of electronic devices on/in those crystalline islands.

While FIGS. 22a-b depict notch 2240 as the crystallization initiator, it is contemplated that any other suitable feature in any surface of reservoir 2230 can be used to initiate and/or control crystallization of the molten corpus. For example, and without limitation, the crystallization initiator can comprise a depression into and/or projection from the surface of reservoir 2230. In some implementations, such depressions and/or projections can comprise a sharp and/or angled feature to promote and/or initiate crystallization. In some implementations, the crystallization initiator can comprise an additional component and/or different material secured to the surface of reservoir 2230 such that the additional component and/or different material would come into contact with the molten corpus.

In implementations where the crystallization initiator is a feature in a surface of reservoir 2230, the cooling profile and/or temperature profile of the components in contact with the molten corpus (e.g. the template, the substrate, and/or any surrounding atmosphere/gases) can be controlled to promote the wave of crystallization starting from the reservoir and propagating through the channels, and towards the substrate to enable the crystallization initiator to influence crystal grain(s) and crystal orientation of the crystallized corpus.

While FIGS. 19-22 depict templates comprising one or more channels formed in the body of the template, it is contemplated that different suitable shapes, geometries, and/or structures can be used for the template. For example, and without limitation, the template can comprise one or more channels that are separately formed and then secured together. In other implementations, the template can comprise multiple pieces that cooperate to form the channels. In such an implementation, when the crystallized corpus and/or the crystalline island(s) is formed, the various pieces of the template can be separated and/or removed from one another to liberate the crystallized corpus and/or the crystalline island(s).

The above-described implementations of the invention are intended to be examples of the present invention and alterations and modifications may be effected thereto, by those of skill in the art, without departing from the scope of the invention which is defined solely by the claims appended hereto.

I claim:

1. A method of fabricating a crystalline island of an island material, the method comprising:
    depositing the island material on a substrate;
    heating the substrate and the island material, the heating melting the island material to form a molten corpus, the heating also forming a molten disk comprising oxygen and the island material, the molten disk disposed between the molten corpus and the substrate; and
    cooling the substrate, the molten corpus, and the molten disk to crystallize the molten corpus to form a crystallized corpus, at least a portion of the crystallized corpus forming the crystalline island of the island material.

2. The method of claim 1, further comprising planarizing at least a portion of the crystalline island to expose a cross-section of the crystalline island.

3. The method of claim 1, further comprising, after the cooling:
    over-coating the crystalline island and the substrate with an over-coating layer to form a stack; and
    planarizing the stack to expose a cross-section of the crystalline island.

4. The method of claim 1, further comprising, before the depositing:
    forming an oxide layer on the substrate; and
    wherein:
    the depositing comprises depositing the island material on the oxide layer; and
    the molten disk comprises the oxide layer in a molten state.

5. The method of claim 4, wherein the forming the oxide layer comprises depositing on the substrate the oxide layer comprising an oxide of the island material.

6. The method of claim 5, wherein the depositing comprises depositing the oxide layer according to a predetermined pattern.

7. The method of claim 4, wherein the forming the oxide layer comprises:
    depositing the island material on the substrate according to a predetermined pattern; and
    oxidizing the island material.

8. The method of claim 4, wherein the heating comprises heating the substrate, the island material, and the oxide layer in a non-oxidizing atmosphere.

9. The method of claim 1, further comprising one or more of, before the depositing:
    polishing the substrate according to a predetermined pattern; and
    roughening the substrate according to the predetermined pattern.

10. The method of claim 1, wherein the substrate comprises alumina.

11. The method of claim 10, wherein the molten disk further comprises aluminum originating from the substrate.

12. The method of claim 1, wherein the island material comprises silicon and the heating comprises heating the substrate and the island material to at least about 1500° C.

13. The method of claim 1, wherein:
    cooling the molten corpus forms a first solid portion distal from the substrate and a second solid portion proximal the substrate, the first solid portion separating spontaneously from the second solid portion during the cooling, the second solid portion forming the crystalline island.

14. The method of claim 1, wherein the depositing comprises:
   positioning a template on a surface of the substrate, the template comprising a channel having a first end abutting the surface and a second end opposite the first end, the surface capping the first end; and
   filling at least a portion of the channel with the island material.

15. The method of claim 14, further comprising:
   after the cooling, removing the template from the substrate.

16. The method of claim 15, wherein after the removing, a first portion of the crystallized corpus remains on the substrate to form the crystalline island and a second portion of the crystallized corpus remains in the channel.

17. The method of claim 14, wherein the channel comprises:
   a first region proximate the first end, in the first region the channel having a first cross-sectional area; and
   a second region distal from the first end, in the second region the channel having a second cross-sectional area, the first cross-sectional area different from the second cross-sectional area.

18. The method of claim 17, wherein an inner surface of the channel defines a vertex separating the first region from the second region.

19. The method of claim 14, wherein:
   the template further comprises one or more further channels, each further channel having a corresponding first end abutting the surface and a corresponding second end opposite the corresponding first end, the surface capping the corresponding first end; and
   the depositing further comprises filling at least a portion of the one or more further channels with the island material.

20. The method of claim 14, wherein the second end is in communication with a reservoir configured to store the island material for at least partially filling the channel with the island material.

21. The method of claim 20, wherein the reservoir is integrally formed with the template.

22. The method of claim 20, wherein the reservoir comprises a crystallization initiator, the crystallization initiator comprising one or more of a depression into and an extension from a reservoir surface, the crystallization initiator configured to come into contact with the molten corpus and initiate crystallization during the cooling.

* * * * *